United States Patent
Zhang et al.

(10) Patent No.: US 11,990,084 B2
(45) Date of Patent: May 21, 2024

(54) DISPLAY PANEL AND DISPLAY DEVICE

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Mengmeng Zhang, Wuhan (CN); Xingyao Zhou, Wuhan (CN); Yue Li, Wuhan (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/955,577

(22) Filed: Sep. 29, 2022

(65) Prior Publication Data

US 2024/0005842 A1    Jan. 4, 2024

(30) Foreign Application Priority Data

Jun. 29, 2022   (CN) .......................... 202210751335.1

(51) Int. Cl.
*G09G 3/32* (2016.01)
*G11C 19/28* (2006.01)

(52) U.S. Cl.
CPC ............... *G09G 3/32* (2013.01); *G11C 19/28* (2013.01); *G09G 2300/0426* (2013.01); *G09G 2310/0286* (2013.01)

(58) Field of Classification Search
CPC .. G11C 19/28; G09G 2310/0286; G09G 3/32; G09G 2300/0426
See application file for complete search history.

(56) References Cited

U.S. PATENT DOCUMENTS

2017/0263187 A1*  9/2017  Zhu ...................... G09G 3/3233
2021/0134917 A1*  5/2021  Li ......................... G09G 3/3275
(Continued)

FOREIGN PATENT DOCUMENTS

CN        101281719 B     10/2010
CN        105096874 A     11/2015
(Continued)

OTHER PUBLICATIONS

The First Office Action for Chinese Application No. 202210751335.1, dated Apr. 10, 2024, 16 pages.

*Primary Examiner* — Xuemei Zheng
(74) *Attorney, Agent, or Firm* — East IP P.C.

(57) ABSTRACT

A display panel includes: a plurality of light-emitting pixels arranged in an array, a first shift register unit and a second shift register unit, wherein the first shift register unit is connected to data writing transistors in an $i^{th}$ row and an $(i+1)^{th}$ row and configured to provide a first controlling signal for the two adjacent rows of pixel circuits, and the data writing transistor is turned on in response to the first controlling signal; the second shift register unit is connected to threshold compensating transistors in the $i^{th}$ row and an $(i-1)^{th}$ row, and configured to provide a second controlling signal for the two adjacent rows of pixel circuits, and the threshold compensating transistor is turned on in response to the second controlling signal; and wherein a first turn-on period of the data writing transistor is partially overlapped with a second turn-on period of the threshold compensating transistor.

15 Claims, 14 Drawing Sheets

(56) References Cited

U.S. PATENT DOCUMENTS

| | | | |
|---|---|---|---|
| 2021/0375213 A1 | 12/2021 | Shanghai | |
| 2022/0310733 A1* | 9/2022 | Kim | H10K 59/1216 |
| 2022/0319438 A1* | 10/2022 | Sun | H10K 59/00 |
| 2022/0366848 A1* | 11/2022 | Huang | G09G 3/3266 |

FOREIGN PATENT DOCUMENTS

| | | | | |
|---|---|---|---|---|
| CN | 106531075 A | | 3/2017 | |
| CN | 106920804 A | | 7/2017 | |
| CN | 106486053 B | | 1/2019 | |
| CN | 109585525 A | | 4/2019 | |
| CN | 112071262 A | | 12/2020 | |
| CN | 112150967 A | | 12/2020 | |
| CN | 112435624 A | | 3/2021 | |
| CN | 112435624 A | * | 3/2021 | ............... G09G 3/30 |
| CN | 113838419 A | | 12/2021 | |
| CN | 113870790 A | | 12/2021 | |
| CN | 113920934 A | | 1/2022 | |
| CN | 114497159 A | | 5/2022 | |
| CN | 114550650 A | | 5/2022 | |
| JP | 2010085935 A | | 4/2010 | |
| JP | 2013033586 A | | 2/2013 | |
| WO | 2019109673 A1 | | 6/2019 | |

\* cited by examiner

DISPLAY PANEL AND DISPLAY DEVICE

CROSS-REFERENCE TO RELATED APPLICATION

The present application is based upon and claims priority to Chinese Patent Application No. 202210751335.1, filed on Jun. 29, 2022, which is incorporated herein by reference in its entirety.

TECHNICAL FIELD

The present application relates to the field of display technology, and particularly relates to a display panel and a display device.

BACKGROUND

At present, a hybrid TFT display (HTD) pixel design, that is, a pixel circuit including both a low-temperature poly-silicon transistor and an oxide transistor, is usually applied in low-frequency display.

In an existing low-temperature poly-silicon (LTPS) pixel design, thin film transistors in a pixel circuit are P-type low-temperature poly-silicon transistors, and a set of low-level active scanning signals ScanP and a set of light-emission controlling signals Emit are used to implement progressive scanning in order to display. In the HTD pixel design, since a high-level signal is required to turn on the oxide transistor, a set of high-level active scanning signals ScanN is required additionally.

Compared with the LTPS pixel design, addition of additional scanning signal lines in the HTD pixel design requires additional vertical shift register (VSR) units in a non-display area of a display panel, which results in a widened frame area of the display panel and thus a reduced screen-to-body ratio.

SUMMARY

In a first aspect, the embodiments of the present application provides a display panel. The display panel includes: a plurality of light-emitting pixels arranged in an array, the light-emitting pixel including a pixel circuit and a light-emitting element, the pixel circuit including a driving transistor, a data writing transistor and a threshold compensating transistor, wherein the driving transistor is configured to provide a driving current for the light-emitting element, and the data writing transistor and the threshold compensating transistor are of different types; a first shift register unit connected to the data writing transistors in $i^{th}$ an row of pixel circuits and the data writing transistors in an $(i+1)^{th}$ row of pixel circuits, and configured to provide a first controlling signal for the two adjacent rows of pixel circuits; wherein a first electrode of the data writing transistor is electrically connected to a data signal line, a second electrode of the data writing transistor is electrically connected to a first electrode of the threshold compensating transistor, and the data writing transistor is turned on in response to the first controlling signal; and a second shift register unit connected to the threshold compensating transistors in the $i^{th}$ row of pixel circuits and the threshold compensating transistors in an $(i-1)^{th}$ row of pixel circuits, and configured to provide a second controlling signal for the two adjacent rows of pixel circuits; wherein a first electrode of the threshold compensating transistor is electrically connected to the second electrode of the data writing transistor, a second electrode of the threshold compensating transistor is electrically connected to a gate of the driving transistor, and the threshold compensating transistor is turned on in response to the second controlling signal; and wherein a first turn-on period of the data writing transistor is partially overlapped with a second turn-on period of the threshold compensating transistor.

In a second aspect, the embodiments of the present application provides a display device. The display device includes the display panel described above.

BRIEF DESCRIPTION OF THE DRAWINGS

In order to illustrate technical solutions of embodiments of the present application more clearly, the drawings required for the embodiments of the present application will be briefly described. Obviously, the drawings described below illustrate only some embodiments of the present application. For a person skilled in the art, other drawings can also be obtained from these drawings without any inventive efforts.

Reference Signs

Figure 1:
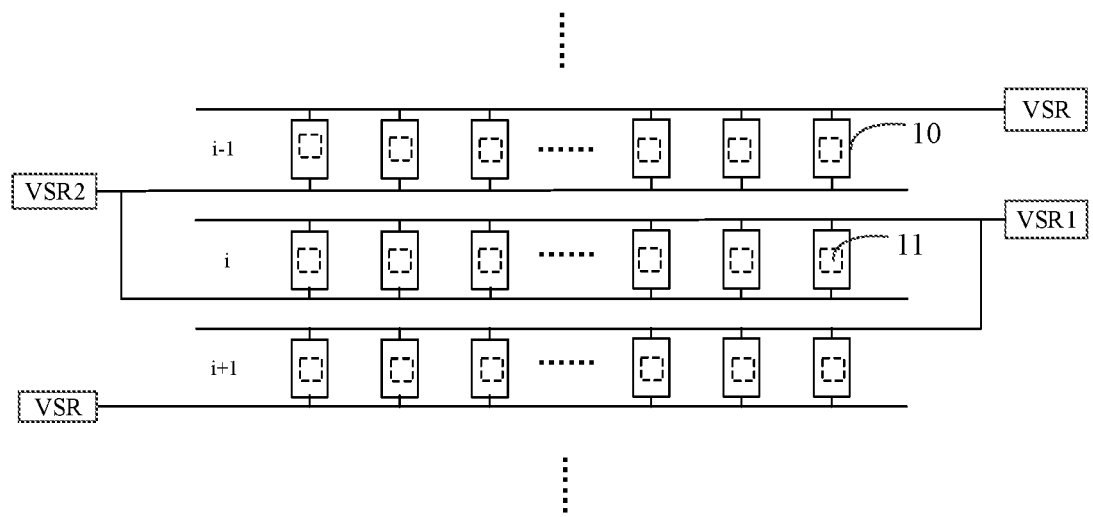
FIG. 1 is a schematic structural view of a part of pixel circuit rows in a display panel according to an embodiment of the present application.

10: Light-emitting pixel; 11: Pixel circuit; L: Light-emitting element; VSR1: First shift register unit; VSR2: Second shift register unit; EM: Third shift register unit; La: First pixel circuit row; Lb: Second pixel circuit row; T1: Driving transistor; T2: Data writing transistor; T3: Threshold compensating transistor; T4: First light-emission controlling transistor; T5: Second light-emission controlling transistor; T6: First initializing transistor; T7: Second initializing transistor; T8: Bias adjusting transistor; S1: First controlling signal ; S2: Second controlling signal; S3: First initialization controlling signal; S4: Second initialization controlling signal; PVDD: First power supply signal; PVEE: Second power signal; Vdata: Data signal.

DETAILED DESCRIPTION

The features and exemplary embodiments of various aspects of the present application will be described in detail below. In order to make the purpose, technical solutions and advantages of the present application more clear, the present application will be further described in detail below with reference to the accompanying drawings and specific embodiments. It should be understood that the specific embodiments described herein are only intended to explain the present application, but not to limit the present application. It will be apparent to a person skilled in the art that the present application may be practiced without some of these specific details. The following description of the embodiments is merely to provide a better understanding of the present application by illustrating examples of the present application.

It should be noted that, in this document, relational terms such as first and second are used only to distinguish one entity or operation from another entity or operation, and do not necessarily require or imply such an actual relationship or sequence between these entities or operations. Moreover, the terms "comprising", "including" or any other variation thereof are intended to encompass a non-exclusive inclusion such that a process, method, article or device that includes a list of elements includes not only those elements, but also includes other elements that are not explicitly listed but inherent to such a process, method, article or device. Without further limitation, an element defined by the term "comprising . . . " does not preclude presence of additional elements in a process, method, article or device that includes the element.

It should be noted that the embodiments in the present application and the features of the embodiments may be combined with each other in the case of no conflict. The embodiments will be described in detail below with reference to the accompanying drawings.

At present, a hybrid TFT display (HTD) pixel design, that is, a pixel circuit including both a low-temperature poly-silicon transistor and an oxide transistor, is usually applied in low-frequency display.

In an existing low-temperature poly-silicon (LTPS) pixel design, thin film transistors in the a pixel circuit are P-type low-temperature poly-silicon transistors, and a set of low-level active scanning signals ScanP and a set of light-emission controlling signals Emit are used to implement row-by-row progressive scanning in order to display. In the HTD pixel design, since a high-level signal is required to turn on the oxide transistor, a set of high-level active scanning signals ScanN is required additionally.

Compared with the LTPS pixel design, addition of additional scanning signal lines in the HTD pixel design requires additional vertical shift register (VSR) units in a non-display area of the a display panel, which results in a widened frame area of the display panel and thus a reduced screen-to-body ratio.

In order to solve the above discussed technical problems, the embodiments of the present application provide a display panel and a display device. The display panel provided by embodiments of the present application is first described below.

FIG. 1 illustrates a schematic structural view of a display panel according to an embodiment of the present application. The display panel includes a plurality of light-emitting pixels 10, a first shift register unit VSR1 and a second shift register unit VSR2.

Figure 2:
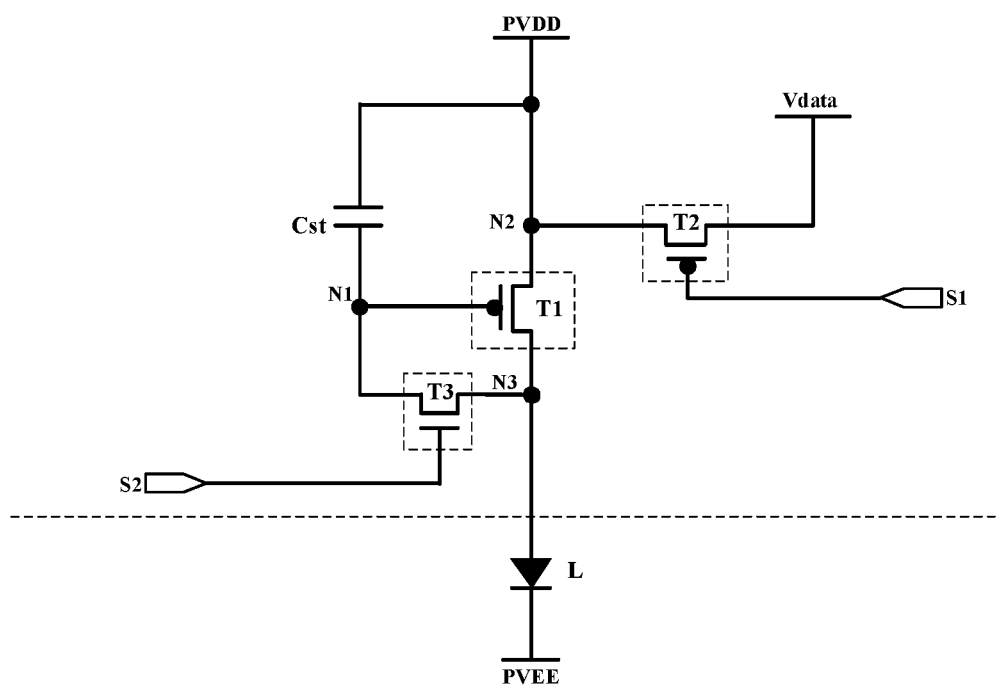
FIG. 2 is a schematic view of a pixel circuit according to an embodiment of the present application.

With reference to FIG. 1 and FIG. 2, the plurality of light-emitting pixels 10 are arranged in an array in the display panel and each light-emitting pixel 10 includes a pixel circuit 11 and a light-emitting element L. The pixel circuit 11 includes a driving transistor T1, a data writing transistor T2 and a threshold compensating transistor T3. The driving transistor T1 is configured to provide a driving current for the light-emitting element L when it is turned on, so that the light-emitting element L is driven by the driving current to emit light. When the data writing transistor T2 and the threshold compensating transistor T3 are turned on at a same time, a data signal Vdata is written into the pixel circuit 11 to implement charging of the pixel circuit 11. The data writing transistor T2 and the threshold compensating transistor T3 are of different types. For example, the data writing transistor T2 may be a P-type transistor, and the threshold compensating transistor T3 may be an N-type transistor.

It should be understood that, when the pixel circuit 11 is charged, it requires that the data writing transistor T2 and the threshold compensating transistor T3 are turned on at the same time. Since the data writing transistor T2 and the threshold compensating transistor T3 are of different types, a high-level controlling signal is required to control the data writing transistor T2, while a low-level controlling signal is required to control the threshold compensating transistor T3. Only if the high-level controlling signal and the low-level controlling signal have an overlapped valid turn-on zone, there is a time zone for the data writing transistor T2 and the threshold compensating transistor T3 during which the data writing transistor T2 and the threshold compensating transistor T3 are both turned on at the same time.

Each of the array of light-emitting pixels 10 includes the pixel circuit 11 and the light-emitting element L, so a plurality of pixel circuits 11 correspond to the array of light-emitting pixels 10 on a one-to-one basis, that is, the plurality of pixel circuits 11 may also be arranged in an array correspondingly. For example, a plurality of light-emitting pixels 10 in a same may correspond to a plurality of pixel circuits 11, respectively. Even when the plurality of pixel circuits 11 are not arranged in one straight line because of an involved arrangement rule and light transmittance of the display panel, the plurality of pixel circuits 11 can be determined as pixel circuits 11 in a same row.

The first shift register unit VSR1 is electrically connected to the data writing transistor T2 in each of an $i^{th}$ row (i may be a positive integer) of pixel circuits 11. The first shift register unit VSR1 is also connected to the data writing transistor T2 in each of an $(i+1)^{th}$ row of pixel circuits 11. The first shift register unit VSR1 is configured to provide a first controlling signal S1 for the two adjacent rows of pixel circuits 11, that is, the $i^{th}$ row of pixel circuits 11 and the $(i+1)^{th}$ row of pixel circuits 11. A first electrode of the data writing transistor T2 is electrically connected to a data signal line, and a second electrode of the data writing transistor T2 is electrically connected to a first electrode of the threshold compensating transistor T3. The data writing transistor T2 is turned on in response to the first controlling signal S1. That is, a controlling terminal of the data writing transistor T2 is electrically connected to the first shift register unit VSR1, and when the first shift register unit VSR1 provides the first controlling signal S1, the data writing transistor T2 is turned on. When the data writing transistor T2 is turned on, the data signal line is connected to the threshold compensating transistor T3.

The second shift register unit VSR2 is electrically connected to the threshold compensating transistor T3 in each of the $i^{th}$ row of pixel circuits 11. The second shift register unit VSR2 is also connected to the threshold compensating transistor T3 in each of a $(i-1)^{th}$ row of pixel circuits 11. The second shift register unit VSR2 is configured to provide a second controlling signal S2 for the pixel circuits 11 in the two adjacent rows, that is, the $i^{th}$ row of pixel circuits 11 and the $(i-1)^{th}$ row of pixel circuits 11. A first electrode of the threshold compensating transistor T3 is electrically connected to the second electrode of the data writing transistor T2, and a second electrode of the threshold compensating transistor T3 is electrically connected to a gate of the driving transistor T1. The threshold compensating transistor T3 is turned on in response to the second controlling signal S2. That is, a controlling terminal of the threshold compensating transistor T3 is electrically connected to the second shift register unit VSR2, and when the second shift register unit VSR2 provides the second controlling signal S2, the threshold compensating transistor T3 is turned on. When the threshold compensating transistor T3 is turned on, the data writing transistor T2 is connected to the gate of the driving transistor T1.

A time zone during which the first shift register unit VSR1 provides the first controlling signal S1 may be a first turn-on period, and a time zone during which the second shift register unit VSR2 provides the second controlling signal S2 may be a second turn-on period. Therefore, the data writing transistor T2 is turned on during the first turn-on period, and the threshold compensating transistor T3 is turned on during the second turn-on period. The first turn-on period and the second turn-on period may be partially overlapped with each other. During the partially overlapped period, the data writing transistor T2 and the threshold compensating transistor T3 are turned on at the same time. At this time, a data signal Vdata provided by the data signal line can be transmitted to the gate of the driving transistor T1 through the turned-on data writing transistor T2 and the threshold compensating transistor T3, so that the pixel circuit 11 is charged by the data signal Vdata.

For three adjacent rows (i-1, i and i+1) of pixel circuits 11 (in the case where the pixel circuit 11 employs the HTD pixel design, that is, the pixel circuit 11 includes a P-type transistor and a N-type transistor), a set of low-level active scanning signals ScanP and a set of high-level active scanning signals ScanN are required for each row of pixel circuits 11 in the related art to implement driving of the three rows of pixel circuits 11 by progressive scanning. That is, two shift register units are required for each row of pixel circuits 11, and then for the three rows of pixel circuits 11, six shift register units are required in a frame area of the display panel to generate three sets of ScanP and three sets of ScanN required by the respective three rows of pixel circuits 11.

In contrast, in the above embodiment as shown in FIG. 1, the first shift register unit VSR1 is connected to the data writing transistors T2 in the $i^{th}$ row and the $(i+1)^{th}$ row, and the second shift register unit VSR2 is connected to the threshold compensating transistors T3 in the $i^{th}$ row and the $(i-1)^{th}$ row. In this way, in order to implement driving of three rows of pixel circuits 11 by progressive scanning, two additional shift register units are needed to provide scanning signals for the data writing transistor T2 in the $(i-1)^{th}$ row and the threshold compensating transistor T3 in the $(i+1)^{th}$ row, respectively. That is, in this embodiment, driving of three rows of adjacent pixel circuits 11 by progressive scanning can be implemented by using four shift register units. Compared with the related art, two shift register units are saved, and thus the frame area of the display panel can be narrowed down and the screen-to-body ratio can be improved.

It should be understood that, in the above embodiment in which driving of three rows of adjacent pixel circuits 11 by progressive scanning is implemented by using four shift register units, a partially overlapped time zone exists between a scanning signal provided by the shift register unit which provides the scanning signal for the data writing transistors T2 in the $(i-1)^{th}$ row and the second controlling signal S2 provided by the second shift register unit VSR2. During the partially overlapped time zone, the data writing transistors T2 in the $(i-1)^{th}$ row and the threshold compensating transistors T3 in the $(i-1)^{th}$ row are turned on at a same time, so that the $(i-1)^{th}$ row of pixel circuits 11 can be charged by data signal lines. The first controlling signal S1 provided by the first shift register unit VSR1 corresponds to the first turn-on period, and the second controlling signal S2 provided by the second shift register unit VSR2 corresponds to the second turn-on period. During the partially overlapped time zone of the first turn-on period and the second turn-on period, the data writing transistors T2 in the $i^{th}$ row and the threshold compensating transistors T3 in the $i^{th}$ row are turned on at a same time, so that the $i^{th}$ row of pixel circuits 11 can be charged. Similarly, a partially overlapped time zone exists between a scanning signal provided by the shift register unit which provides the scanning signal for the threshold compensating transistor T3 in the $(i+1)^{th}$ row and the first controlling signal S1 provided by the first shift register unit VSR1. During the partially overlapped time zone, the data writing transistors T2 in the $(i+1)^{th}$ row and the threshold compensating transistors T3 in the $(i+1)^{th}$ row are turned on at a same time, so that the pixel circuits 11 in the $(i+1)^{th}$ row can be charged.

Figure 3:
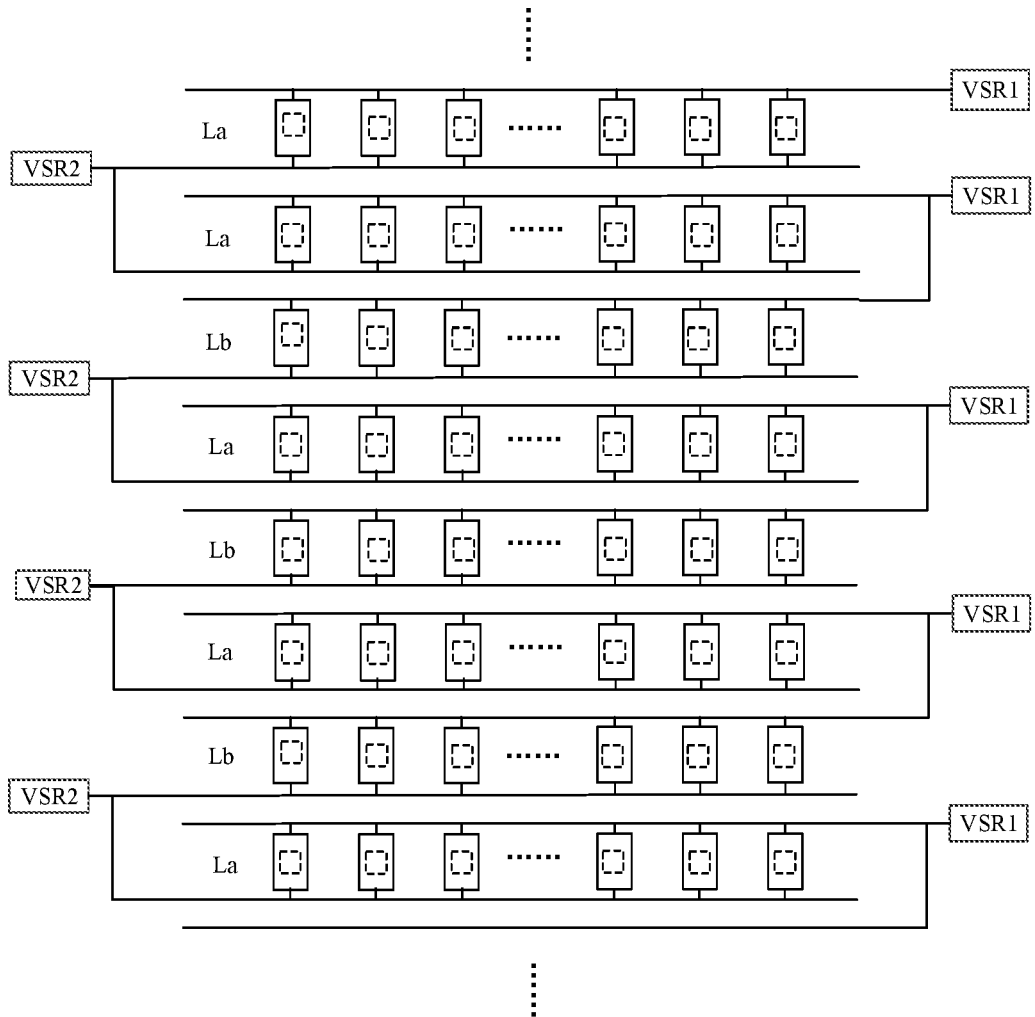
FIG. 3 is a schematic structural view of a part of pixel circuit rows in a display panel according to another embodiment of the present application.

It should be noted that, for three adjacent rows of pixel circuits 11 in a plurality of rows of pixel circuits 11 arranged in a array, the first shift register unit VSR1 is connected to the data writing transistors T2 in the $i^{th}$ row and the $(i+1)^{th}$ row and the second shift register unit VSR2 is connected to the threshold compensating transistors T3 in the i th row and the $(i-1)^{th}$ row through the second shift register unit VSR2, two shift register units can be saved in this way compared with the related art. On this basis, such manner that one shift register unit is connected to two rows of data writing transistors T2 and one shift register unit is connected to two rows of threshold compensating transistors T3 may further be applied to more rows of pixel circuits 11 in the display panel. For example, as shown in FIG. 3, there are a plurality of first shift register units VSR1, each of which is connected to data writing transistors T2 in two adjacent rows of the pixel circuits 11; there are a plurality of second shift register units VSR2, each of which is connected to threshold compensating transistors T3 in two adjacent rows of the pixel circuits 11; and the two adjacent rows of pixel circuits 11 connected by a same first shift register unit VSR1 are connected to two second shift register units VSR2, respectively. In a case where there are a larger number of rows of pixel circuits 11 in the display panel, since each first shift register unit VSR1 is connected to two rows of pixel circuits 11, the total number of first shift register units VSR1 is about half of the number of rows of pixel circuits 11. Similarly, the number of the second shift register units VSR2 is also about the half of the number of the rows of the pixel circuits 11. That is, the total number of the first shift register units VSR1 and the second shift register units VSR2 is approximately the same as the number of rows of pixel circuits 11. Compared with the related art where the same number of ScanP and the same number of ScanN as the number of rows of pixel circuits 11 are required, that is, the number of shift register units is twice of the number of rows of pixel circuits 11, the above embodiment can reduce the number of shift register units that provide progressive scanning signals to about half of the original number, which greatly reduces the number of shift register units required in the frame area, thereby the frame area of the display panel can be narrowed and the screen-to-body ratio can be improved.

In the embodiments, for at least three consecutive rows of pixel circuits 11 arranged in an array in the display panel, the first shift register unit VSR1 and the second shift register unit VSR2 are provided in a staggered arrangement such that the first shift register unit VSR1 is connected to two latter rows of pixel circuits 11 and the second shift register unit VSR2 is connected to two former rows of pixel circuits 11, so shift register units required to drive the three rows of pixel circuits 11 by progressive scanning can be saved, and thus the number of shift register units required in the frame area can be reduced, thereby saving the frame area of the display panel and improving the screen-to-body ratio. In addition, such staggered arrangement where each of the first shift register unit VSR1 and the second shift register unit VSR2 is electrically connected to two adjacent rows of pixel circuits 11, may further be applied in more rows of pixel circuits 11 of the display panel. When each row of pixel circuits 11 in the display panel is configured by using the staggered arrangement of the first shift register unit VSR1 and second shift register unit VSR2, each of the number of the first shift register units VSR1 and the number of the second shift register units VSR2 required in the display panel is one half of the number of the rows of pixel circuits 11. This, compared with the related art where the number of shift register units is twice of the number of the rows of the pixel circuits 11, can reduce the number of shift register units in the frame area by half, which greatly narrows the frame area of the display panel and improves the screen-to-body ratio of the display area.

In some embodiments, the first turn-on period as described may be between a falling edge and a rising edge of the first controlling signal S1, and the second turn-on period may be between a rising edge and a falling edge of the second controlling signal S2. That is, a low-level signal of the first controlling signal S1 may drive the data writing transistor T2 to be turned on, and a high-level signal of the second controlling signal S2 may drive the threshold compensating transistor T3 to be turned on.

It should be understood that in a case where the data writing transistor T2 is a P-type transistor and the threshold compensating transistor T3 is an N-type transistor, the first controlling signal S1 may be active at a low level, and the second controlling signal S2 may be active at a high level. Conversely, in a case where the data writing transistor T2 is an N-type transistor and the threshold compensating transistor T3 is a P-type transistor, the first controlling signal S1 may be active at a high level, and the second controlling signal S2 may be active at a low level.

Figure 4:
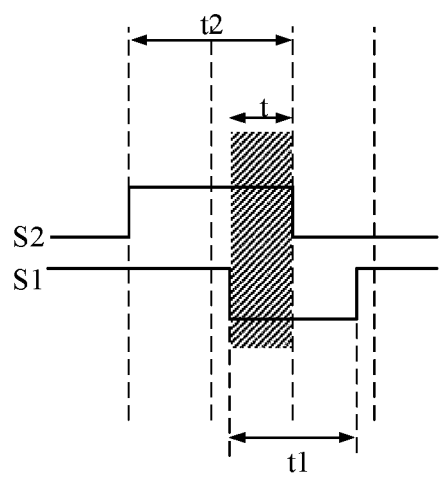
FIG. 4 is a signal time sequence view of a first controlling signal and a second controlling signal according to an embodiment of the present application.
Figure 5:
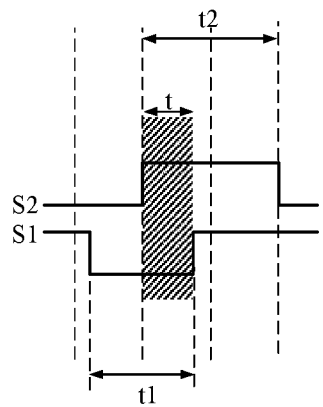
FIG. 5 is a signal time sequence view of a first controlling signal and a second controlling signal according to another embodiment of the present application.

The following are two time sequence setting methods for the first controlling signal S1 and the second controlling signal S2:
  i) As shown in FIG. 4, the rising edge of the second controlling signal S2 may be before a falling edge of the first controlling signal S1, and a falling edge of the second controlling signal S2 may be before a rising edge of the first controlling signal S1. The t1 and t2 represent the first turn-on period and the second turn-on period, respectively, and the overlapped period t of the t1 and the t2 is a partially overlapped time zone of the first turn-on period and the second turn-on period.
  ii) As shown in FIG. 5, the rising edge of the second controlling signal S2 may be after the falling edge of the first controlling signal S1, and the falling edge of the second controlling signal S2 may be after the rising edge of the first controlling signal S1. Similarly, the t1 and t2 represent the first turn-on period and the second turn-on period, respectively, and the t is a partially overlapped time zone of the first turn-on period and the second turn-on period.

The two time sequence setting methods can both achieve a partially overlapped time zone between the first turn-on period and the second turn-on period. In the first time sequence setting method, between the falling edge of the first controlling signal S1 and the falling edge of the second controlling signal S2, the first controlling signal S1 is the low-level signal, and the second controlling signal S2 is the high-level signal. At this time, the first controlling signal S1 drives the data writing transistor T2 to be turned on, the second controlling signal S2 drives the threshold compensating transistor T3 to be turned on, so that the data signal Vdata provided by the data signal line can be written into the gate of the driving transistor T1 so as to charge the pixel circuit. In the second time sequence setting method, between the rising edge of the second controlling signal S2 and the rising edge of the first controlling signal S1, the second controlling signal S2 is the high-level signal, and the first controlling signal S1 is the low-level signal. At this time, the data writing transistor T2 and the threshold compensating transistor T3 are also both turned on to enable charging of the pixel circuit.

It should be understood that, in the embodiments, since the low-level signal of the first controlling signal S1 can drive the data writing transistor T2 to be turned on, the data writing transistor T2 may be the P-type transistor. The high-level signal of the second controlling signal S2 may can drive the threshold compensating transistor T3 to be turned on, so the threshold compensating transistor T3 may be the N-type transistor.

It should be further understood that in the HTD pixel design, the threshold compensating transistor T3 is usually an oxide transistor, and the data writing transistor T2 is usually a low-temperature poly-silicon transistor. The oxide transistor is usually an N-type transistor, and the low-temperature poly-silicon transistor is usually a P-type transistor. However, in another embodiment, the data writing transistor T2 may be an N-type transistor, and the threshold compensating transistor T3 may be a P-type transistor. In this case, the first turn-on period is between the rising edge and the falling edge of the first controlling signal S1, and the second turn-on period is between the falling edge and the rising edge of the second controlling signal S2.

Still referring to FIG. 3, in some embodiments, the display panel may include a plurality of first shift register units VSR1 that are in a cascade connection and a plurality of second shift register units VSR2 that are in a cascade connection. The pixel circuits may include a first row La of pixel circuits and a second row Lb of pixel circuits.

The data writing transistor T2 of pixel circuits in the first row La of pixel circuits is connected to a $j^{th}$ first shift register unit VSR1, and the threshold compensating transistor T3 of the pixel circuit in the first row La of pixel circuits is connected to a $k^{th}$ second shift register unit VSR2.

The data writing transistor T2 of the pixel circuit in the second pixel circuit row Lb is connected to the $j^{th}$ first shift register unit VSR1, and the threshold compensating transistor T3 of the pixel circuit in the second pixel circuit row Lb is connected to a $(k+1)^{th}$ second shift register unit VSR2.

It should be understood that the j and k are all positive integers, and among two rows of pixel circuits connected to a same first shift register unit VSR1 and connected to two adjacent second shift register units VSR2, respectively, the row of pixel circuits connected to a former second shift register unit VSR2 in the two adjacent second shift register units VSR2 is a first pixel circuit row La, and the row of pixel circuits connected to a latter second shift register unit VSR2 in the two adjacent second shift register units VSR2 is a second pixel circuit row Lb. When each row of pixel circuits in the display panel is connected to a first shift register unit VSR1 and a second shift register unit VSR2, the row of pixel circuits can be determined as the first pixel circuit row La or the second pixel circuit row Lb according to the first shift register unit VSR1 and the second shift register unit VSR1 corresponding to the row of pixel circuit.

A first overlapped period exists between the first controlling signal S1 provided by the $j^{th}$ first shift register unit VSR1 and the second controlling signal S2 provided by the $k^{th}$ second shift register unit VSR2. A second overlapped period exists between the first controlling signal S1 provided by the $j^{th}$ first shift register unit VSR1 and the second controlling signal S2 provided by the $(k+1)^{th}$ second shift register unit VSR2. That is, during the first overlapped period, the data writing transistor T2 and the threshold compensating transistor T3 in the pixel circuit of the first row La of pixel circuits are turned on at a same time, and at this time, the pixel circuit in the first row La of pixel circuits can be charged by the data signal line. During the second overlapped period, the data writing transistor T2 and the threshold compensating transistor T3 in the pixel circuit of the second row Lb of pixel circuits are turned on at a same time, and at this time, the pixel circuit in the second row Lb of pixel circuits can be charged by the data signal line.

It should be understood that, for a row of pixel circuits next to the second row Lb of pixel circuits, threshold compensating transistor T3 of the pixel circuit in the row of pixel circuits is also connected to the $(k+1)^{th}$ second shift register unit VSR2, and the data writing transistor T2 of the pixel circuit in the row of pixel circuits is connected to the $(j+1)^{th}$ first shift register unit VSR1. Since the first shift register units VSR1 are in a cascade connection, and output a scanning signal row by row, an overlapped period also exists between the $(k+1)^{th}$ second shift register unit VSR2 and the $(j+1)^{th}$ first shift register unit VSR1. During the overlapped period, the row of pixel circuits next to the second row Lb of pixel circuits can be charged. In this way, the pixel circuit in each row of pixel circuits in the display panel can be electrically connected to one first shift register unit VSR1 and one second shift register unit VSR2; and the first controlling signal S1 provided by the first shift register unit VSR1 and the second controlling signal S2 provided by the second shift register unit VSR2 have an overlapped period, during which the pixel circuit in the row of pixel circuits can be charged, thereby implementing driving by progressive scanning.

Figure 6:
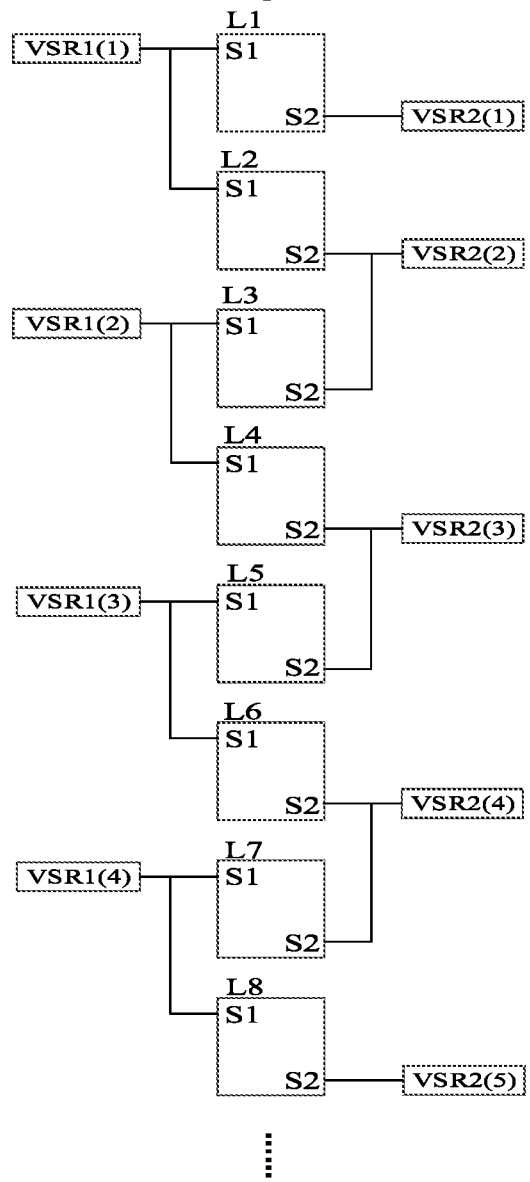
FIG. 6 is a schematic view illustrating connections of a part of first shift register units and a part of second shift register units with a part of pixel circuit rows according to an embodiment of the present application.

With reference to FIG. 6, which shows connections among a part of rows of pixel circuits, a part of first shift register units VSR1 and a part of second shift register units VSR2. L1 to L8 represents a first row of the pixel circuit 11 to an eighth row of pixel circuits, respectively. S1 represents a controlling terminal for the data writing transistors T2 of all pixel circuits in a same row of pixel circuits, and S2 represent a controlling terminal of the threshold compensating transistors T3 of all pixel circuits in a same row of pixel circuits. Taking the L1 as an example, VSR1(1) may represents a first one of the cascaded plurality of first shift register units VSR1, and VSR2(1) may represents a first one of the cascaded plurality of second shift register units VSR2. The VSR1(1) is connected to the S1 in both the L1 and the L2, and the VSR2(1) is connected to the S2 in the L1, which means that the first one of the first shift register units VSR1 is connected to the data writing transistor T2 of every pixel circuit in a first row of pixel circuits and a second row of pixel circuit, and the first second shift register unit VSR2 is connected to the threshold compensating transistors T3 of every pixel circuit in the first row of pixel circuits.

Figure 7:
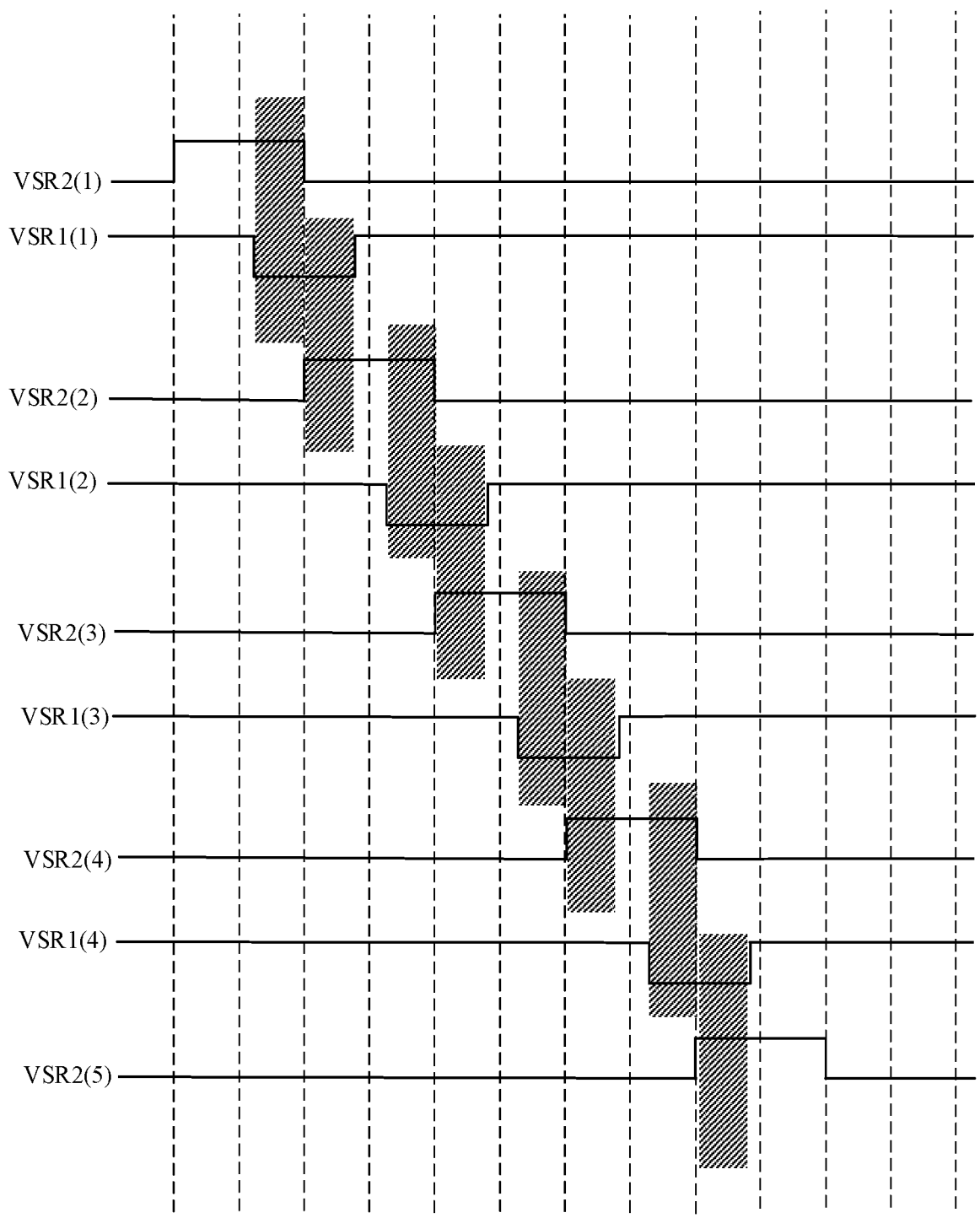
FIG. 7 is a signal time sequence view of a part of first shift register units and a part of second shift register units according to an embodiment of the present application.

As shown in FIG. 7, since a plurality of first shift register units VSR1 are in cascade connection, a scanning signal provided by the first shift register unit VSR1 can be expressed as VSR1(*), where * is a corresponding serial number of the first shift register unit VSR1. Similarly, since a plurality of second shift register units VSR2 are in cascade connection, a scanning signal provided by the second shift register unit VSR2 can be expressed as VSR2(*), where * is a corresponding serial number of the second shift register unit VSR2.

Referring to both FIG. 6 and FIG. 7, it should be known that each row of pixel circuits in L1 to L8 is connected to a corresponding first shift register unit VSR1 and a corresponding second shift register unit VSR2. Taking L5 as an example, the data writing transistor T2 of each pixel circuit in the row of pixel circuits corresponding to L5 is connected to a VSR2(3), and the threshold compensating transistor T3 in each pixel circuit in the row of pixel circuits corresponding to L5 is connected to a VSR1(3). Therefore, an overlapped zone between a high-level zone of the VSR2(3) and a low-level zone of the VSR1(3) as shown in FIG. 7 is a period for charging of each pixel circuit in L5.

In some embodiments, a time length of the first overlapping period may be equal to a time length of the second overlapping period.

It should be understood that one first shift register unit VSR1 is electrically connected to two adjacent rows of pixel circuits, the two adjacent rows of pixel circuits are connected to two second shift register units VSR2, respectively, and the two second shift register unit VSR2 are generally adjacent and arranged in a cascade connection. The overlapped period corresponding to the first shift register unit VSR1 and one of the two second shift register units VSR2 is the first overlap period and the overlapped period corresponding to the first shift register unit USR1 and the other one of the two second shift register units VSR2 is the second overlap period. Therefore, in one image frame, a time length for charging of one of the two rows of pixel circuits is the first overlapped period and a time length for charging of the other one of the two rows of pixel circuits is the second overlapped period. If the time length of the first overlapped period is different from the time length of the second overlapped period, time lengths for charging the two adjacent rows of pixel circuits are different, which causes a row of pixel circuits with a longer charging time will results greater brightness than a row of pixel circuits with a shorter charging time.

When the time lengths for charging the two rows of pixel circuits are different, the two rows of pixel circuits will result different brightness of actual emitted light. In order to avoid the brightness difference due to different time lengths for charging of the two rows of pixel circuits, signal time sequences of the first controlling signal S1 and the second controlling signal S2 can be set such that the time length of the first overlapped period is equal to the time length of the second overlapped period, which ensures uniformity of the time lengths for charging of the two rows of pixel circuits.

It should be understood that, when the time lengths for charging of the two rows of pixel circuits are different, any other method can be used to adjust actual brightness resulted by the two rows of pixel circuits to reduce the brightness difference between the two rows of pixel circuits. In one example, the brightness difference between the two rows of pixel circuits may be reduced by adjusting data voltages provided by the data signal lines to the respective two rows of pixel circuits; the brightness difference between the two rows of pixel circuits may be reduced by adjusting light-emission controlling signals for the two rows of pixel circuits, for example, reducing a duty ratio of the light-emission controlling signal for the row of pixel circuits with the longer charging time, or increasing a duty ratio of the light-emission controlling signal for the row of pixel circuits with the shorter charging time.

Figure 8:
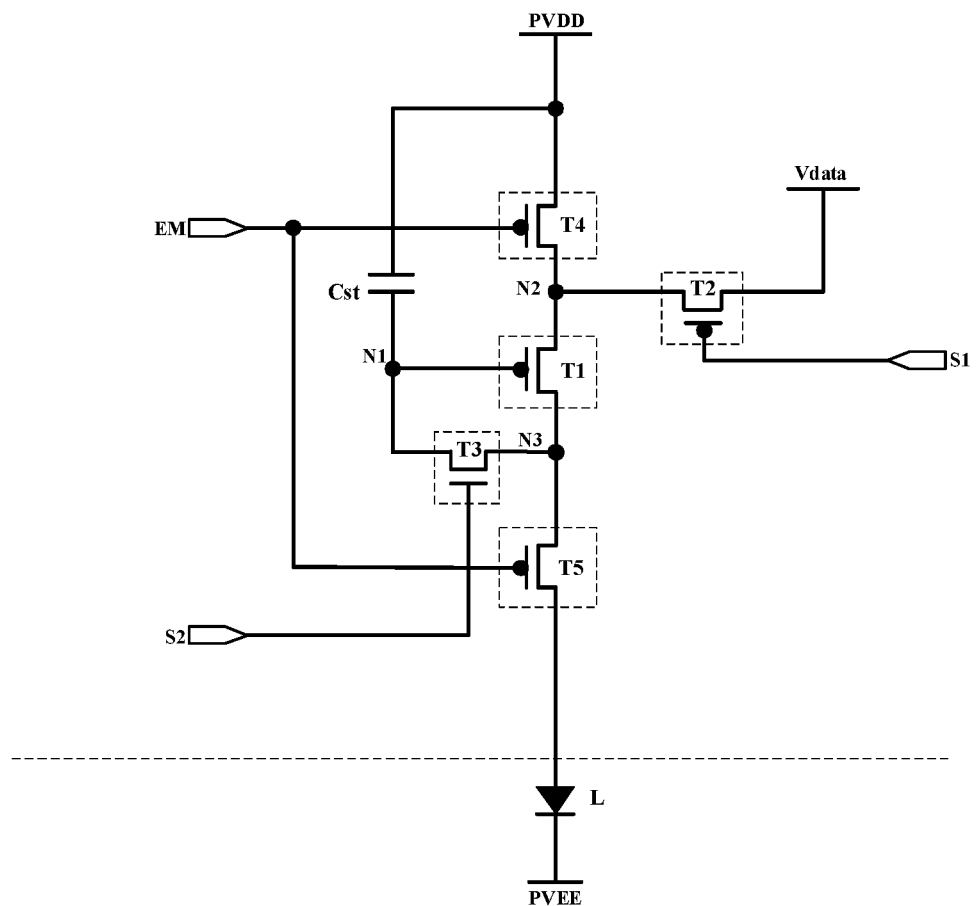
FIG. 8 is a schematic view of a pixel circuit according to another embodiment of the present application.

In some embodiments, as shown in FIG. 8, a first electrode of the driving transistor T1 of the pixel circuit is connected to a first power supply signal PVDD, a second electrode of the driving transistor T1 is connected to a first electrode of the light-emitting element L, and a second electrode of the light-emitting element L is electrically connected to a second power supply signal PVEE. The driving transistor T1 is configured to provide a driving current for the light-emitting element L when it is turned on to drive the light-emitting element L to emit light.

The first electrode of the data writing transistor T2 is electrically connected to the data signal line, the second electrode of the data writing transistor T2 is electrically connected to the first electrode of the driving transistor T1. The data writing transistor T2 is driven by a first controlling signal S1 to be turned on to direct a data signal Vdata provided by the data signal line into the pixel circuit.

The first electrode of the threshold compensating transistor T3 is electrically connected to the second electrode of the driving transistor T1 and the second electrode of the threshold compensating transistor T3 is connected to the gate of the driving transistor T1. The threshold compensating transistor T3 is driven by a second controlling signal S2 to be turned on to direct the data signal Vdata into the gate of the driving transistor T1 so as to charge the pixel circuit.

In some embodiments, the pixel circuit may further include at least one of a first light-emission controlling transistor and a second light-emission controlling transistor to selectively allow the light-emitting element L to enter a light-emitting stage.

Each of the first light-emission controlling transistor and the second light-emission controlling transistor may be driven by a light-emission controlling signal to be turned on, and when the first light-emission controlling transistor and/or the second light-emission controlling transistor together with the driving transistor T1 are turned on, the light-emitting element L can be driven by the driving current to emit light. That is, since turn-on of the light-emission controlling transistor and/or the second light-emission controlling transistor are/is controlled by the light-emission controlling signal, so it can selectively allow the light-emitting element L to enter a light-emitting stage to emit light.

In some embodiments, as shown in FIG. 8, the pixel circuit may include a first light-emission controlling transistor T4 and a second light-emission controlling transistor T5. The first light-emission controlling transistor T4 is connected between the first power supply signal PVDD and the first electrode of the driving transistor T1, and the second light-emission controlling transistor T5 is connected between the second electrode of the driving transistor T1 and the first electrode of the light-emitting element L. The first light-emission controlling transistor T4 and each of the second light-emission controlling transistor T5 is turned on in response to the light-emission controlling signal. That is, when the light-emission controlling signal is a turn-on signal, the first light-emission controlling transistor T4 and the second light-emission controlling transistor T5 are turned on. At this time, the first electrode of the driving transistor T1 is connected to the first power supply signal PVDD, and the second electrode of the driving transistor T1 is connected to the first electrode of the light-emitting element L. When the light-emission controlling signal is a turn-off signal, the first light-emission controlling transistor T4 and the second light-emission controlling transistor T5 are turned off. At this time, the first electrode of the driving transistor T1 is disconnected from the first power supply signal PVDD, and the second electrode of the driving transistor T1 is disconnected from the first electrode of the light-emitting element L.

In some embodiments, the display panel may further include a third shift register unit EM, and the third shift register unit EM may be connected to the light-emission controlling transistors in the $i^{th}$ row of pixel circuits and the light-emission controlling transistors in the $(i+1)^{th}$ row of pixel circuits.

The first shift register unit VSR1 is configured to provide a light-emission controlling signal for the two adjacent rows of pixel circuits, and the light-emission controlling transistors in the pixel circuit are turned on in response to the light-emission controlling signal.

Figure 9:
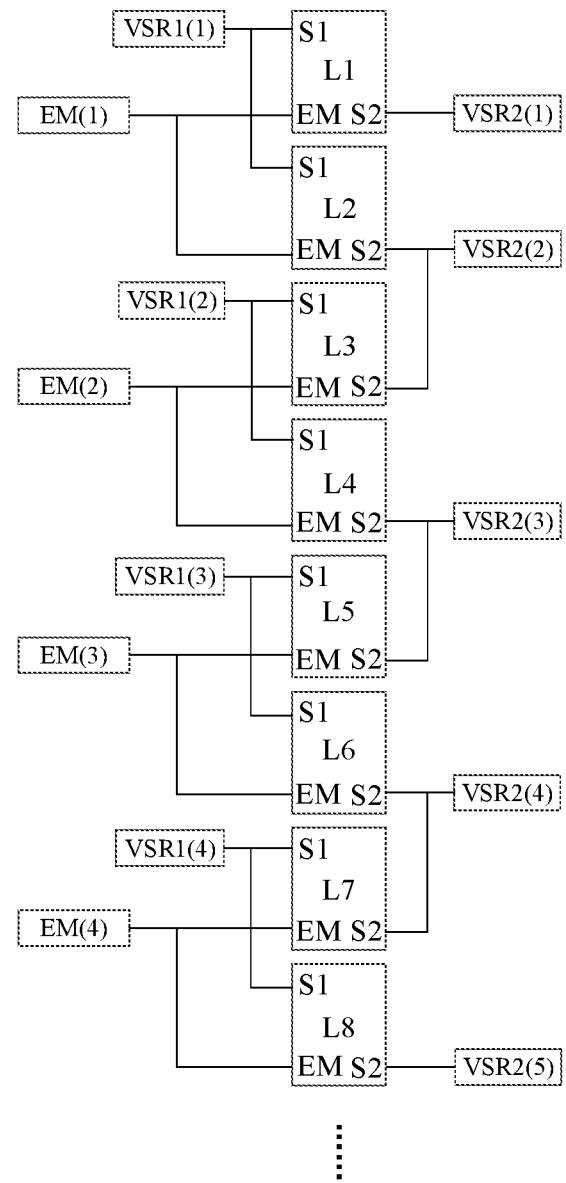
FIG. 9 is a schematic view illustrating connections of a part of third shift register units with a part of pixel circuit rows according to an embodiment of the present application.

Compared with the related art where each row of pixel circuits is electrically connected to one shift register unit, provision of the third shift register unit EM that is electrically connected to the light-emission controlling transistors in the two adjacent rows of pixel circuits enables that one single shift register unit can provide the light-emission controlling signal for two rows of pixel circuits, which reduces the number of shift register units. It should be understood that the arrangement that the third shift register unit EM is electrically connected to two adjacent rows of the pixel circuits may further be applied to other rows of pixel circuits. As shown in FIG. 9, a plurality of cascaded third shift register units EM may be arranged, and each third shift register unit EM is electrically connected to two adjacent rows of pixel circuits. Therefore, the number of third shift register units EM required in the display panel is only half of the total number of rows of the pixel circuits, which can greatly reduce the number of third shift register units EM in the frame area compared with the related art, thereby saving the frame area of the display panel and improving the screen-to-body ratio of the display area.

As shown in FIG. 9, in some embodiments, L1 to L8 represent the first to the eighth rows, respectively. EM represents a controlling terminal for the light-emission controlling transistors of all pixel circuits in a same row of pixel circuits. Taking L1 as an example, EM(1) represents a first one of the cascaded plurality of third shift register units EM. The EM(1) is connected to the EM in the L1 and the EM in the L2, which means that the first one of the third shift register units EM is connected to the light-emission controlling transistors of every pixel circuits in the first row and the second row. That is, each third shift register unit EM can provide the light-emission controlling signal for two rows of pixel circuits.

Figure 10:
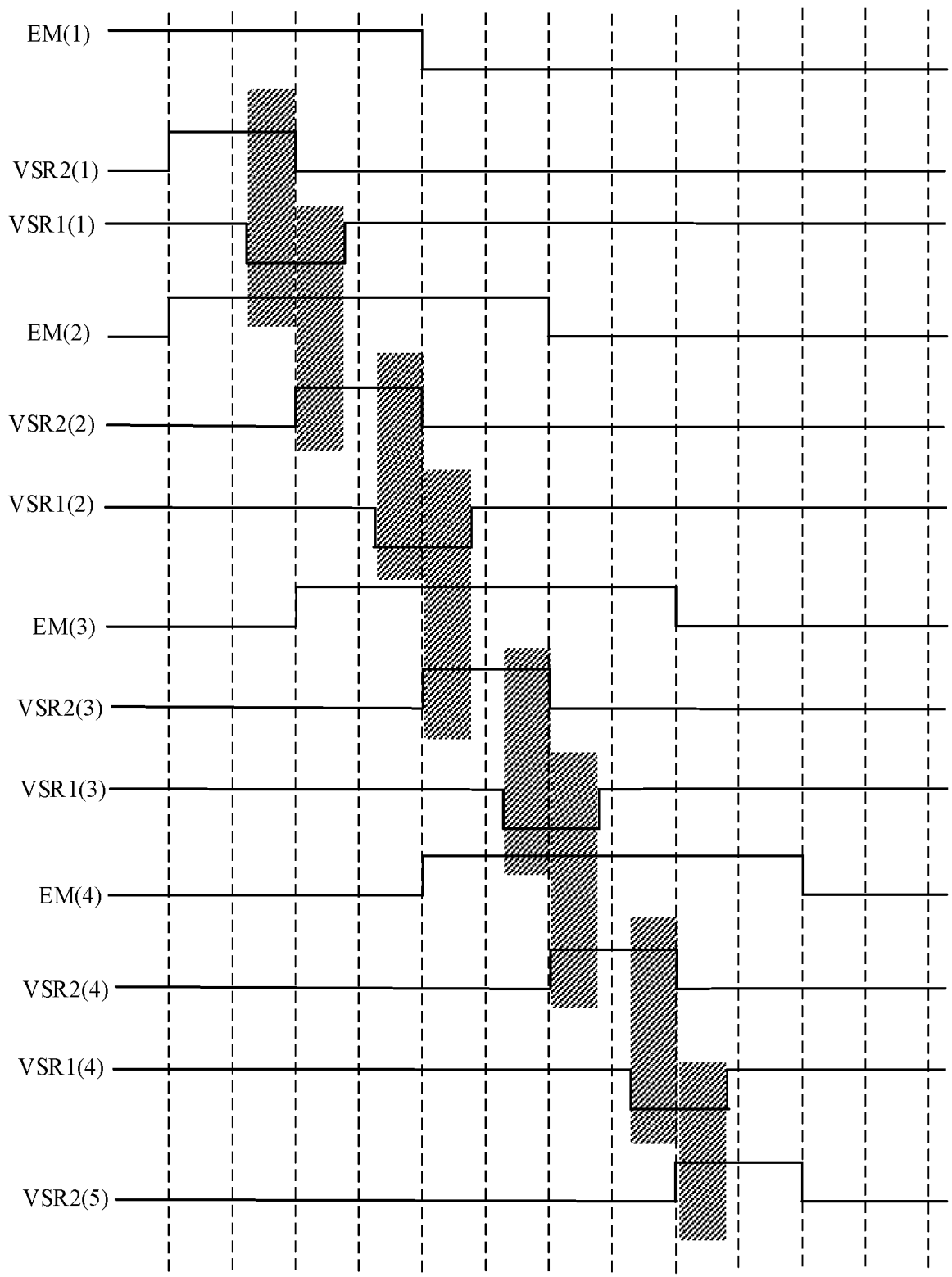
FIG. 10 is a signal time sequence view of a part of third shift register units according to an embodiment of the present application.

As shown in FIG. 10, since a plurality of third shift register units EM are connected in cascade, a valid scanning signal provided by the third shift register unit EM can be expressed as EM(*), where * is a serial number of the third shift register unit EM.

Referring to both FIG. 9 and FIG. 10, when a light-emission controlling signal provided by the third shift register unit EM is a high-level signal, the light-emission controlling transistor is turned off; when a light-emission controlling signal provided by the third shift register unit EM is a low-level signal, the light-emission controlling transistor is turned on. Therefore, when a scanning signal provided by the third shift register unit EM is switched from the high-level signal to the low-level signal, the two rows of pixel circuits corresponding to the third shift register unit EM should complete their respective charging processes. That is, in one image frame, when the scanning signal provided by the third shift register unit EM is switched to the low-level signal, the first shift register unit VSR1 and the second shift register unit VSR2 corresponding to the two rows of pixel circuits have already been switched to a scanning signal that controls the data writing transistor T2 and the threshold compensating transistor T3 to be turned off. For example, in a case where the data writing transistor T2 is a P-type transistor and the threshold compensating transistor T3 is a N-type transistor, a falling edge of the scanning signal provided by the third shift register unit EM is after a rising edge of the scanning signal provided by the first shift register unit VSR1 corresponding to the two rows of pixel circuits; and the falling edge of the scanning signal provided by the third shift register unit EM is after a falling edge of the scanning signal provided by the second shift register unit VSR2 corresponding to the two rows of pixel circuits It should be noted that, since each third shift register unit EM can provide the light-emission controlling signal for two adjacent rows of pixel circuits at a same time, the two rows of pixel circuits receive a valid signal of the light-emission controlling signal at the same time. At this time, the light-emission controlling transistors of the two rows of pixel circuits are turned on at the same time, and two corresponding rows of light-emitting pixels start to emit light at the same time.

Figure 11:
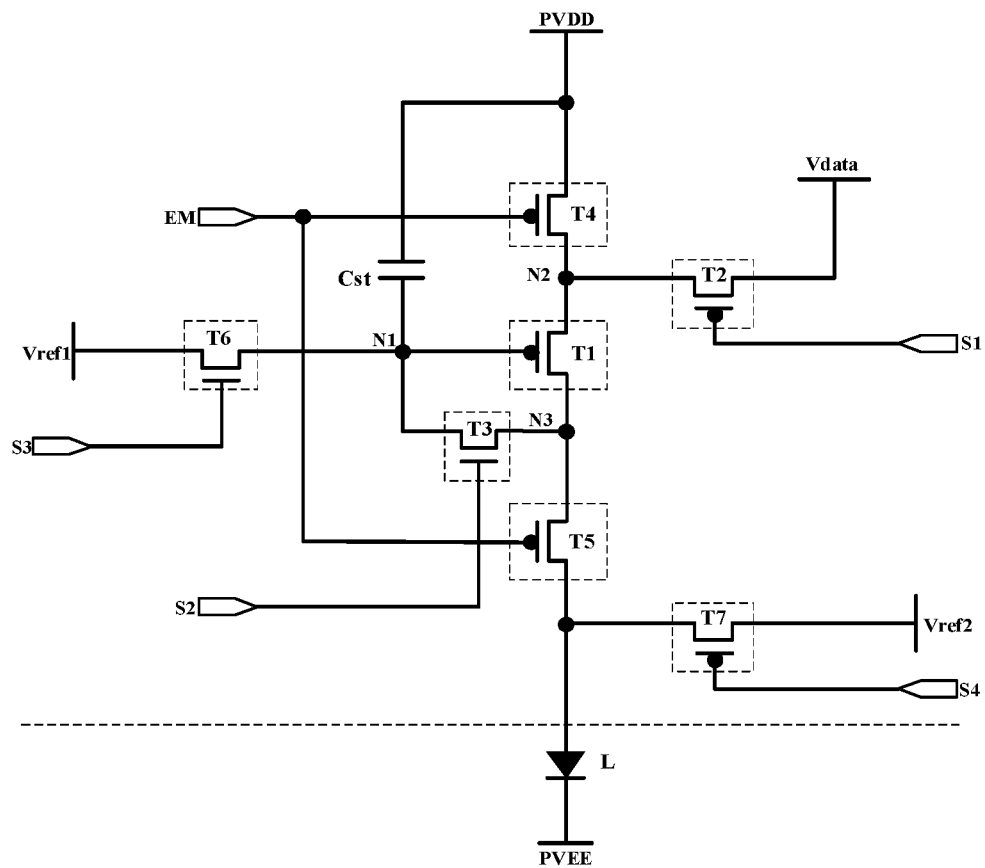
FIG. 11 is a schematic view of a pixel circuit according to yet another embodiment of the present application.

Referring to FIG. 11, in some embodiments, the pixel circuit may further include a first initializing transistor T6 and a second initializing transistor T7.

The first initializing transistor T6 is connected between the gate of the driving transistor T1 and a first initializing signal line, and turned on in response to a first initialization controlling signal S3. When the first initializing transistor T6 is turned on, the first initializing signal line is connected to the gate of the driving transistor T1 to initialize the driving transistor T1.

The second initializing transistor T7 is connected between the first electrode of the light-emitting element L and a second initializing signal line, and turned on in response to a second initialization controlling signal S4. When the second initialing transistor T7 is turned on, the second initializing signal line is connected to the first electrode of the light-emitting element L to initialize the first electrode of the light-emitting element L. The first electrode of the light-emitting element L may be a light-emitting anode.

In some embodiments, the first shift register unit VSR1 may be connected to the second initializing signal line corresponding to the $i^{th}$ row of pixel circuits and the second initializing signal line corresponding to the $(i+1)^{th}$ row of pixel circuits. The first shift register unit VSR1 may be configured to provide the second initialization controlling signal S4 for the two adjacent rows of pixel circuits.

Figure 12:
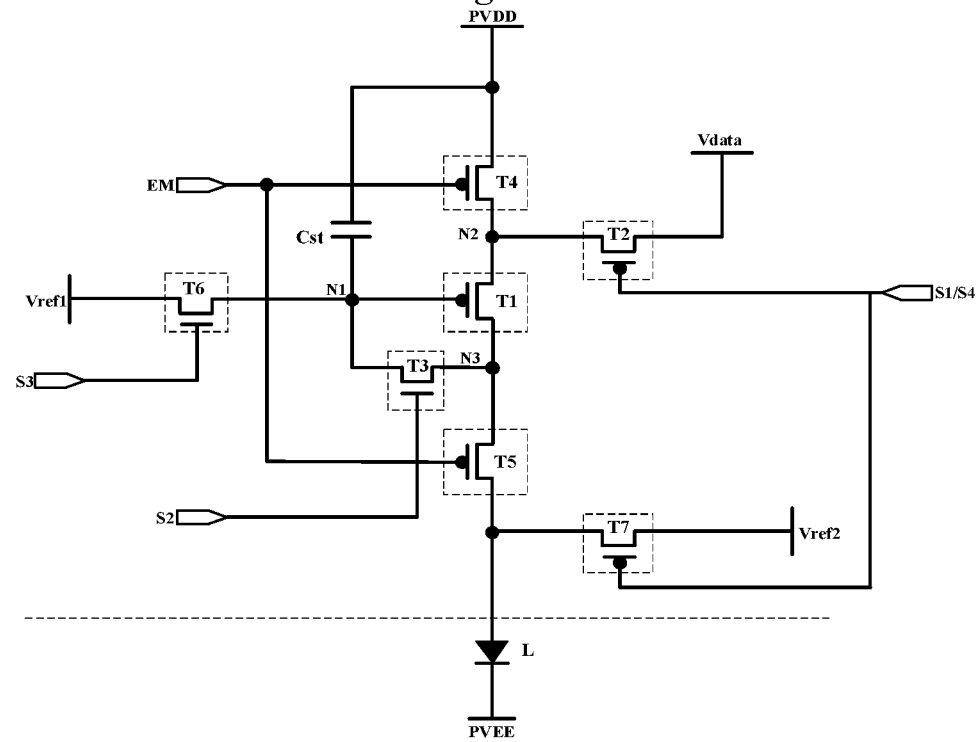
FIG. 12 is a schematic view of a pixel circuit according to yet another embodiment of the present application.

The first shift register unit VSR1 may be configured to provide the first controlling signal S1 for two adjacent rows of pixel circuits such that the data writing transistor T2 of the pixel circuit in the two rows of pixel circuits is turned on in response to a valid signal of the first controlling signal S1 so as to direct the data signal Vdata into the pixel circuits. It should be understood that when the data writing transistor T2 is turned on, the light-emission controlling transistor of the pixel circuit should be in an off-state in order to prevent the light-emitting element from receiving a driving current,. At this time, the driving transistor T1 is disconnected from the first electrode of the light-emitting element L due to turned-off of the light-emission controlling transistor. That is, when the data writing transistor T2 is turned on, the first electrode of the light-emitting element L is disconnected from the driving transistor T1. At this time, the first electrode of the light-emitting element L and the driving transistor T1 do not interfere with each other. Therefore, the driving transistor T1 can be charged, while the first electrode of the light-emitting element L can be initialized with an initializing signal. Therefore, as shown in FIG. 12, the first controlling signal S1 outputted by the first shift register unit VSR1 may further be used as a second initialization controlling signal S4 for the two rows of pixel circuits.

When the first shift register unit VSR1 is connected to two rows of pixel circuits, the first controlling signal S1 provided by the first shift register unit VSR1 may further be used as the second initialization controlling signal S4 for the two rows of pixel circuits that controls the second initializing transistor T7 of each pixel circuit in the two rows of pixel circuits to be turned on, so that the second initializing signal line is connected to the first electrode of the light-emitting element L of the pixel circuit in the two rows of pixel circuits to initialize the first electrode of the light-emitting element L. By reusing the first controlling signal S1 provided by the first shift register unit VSR1 as the second initialization controlling signal S4, the number of shift register units required in the frame area of the display panel can be reduced, thereby reducing the frame area of the display panel and increasing the screen-to-body ratio of the display area.

Figure 13:
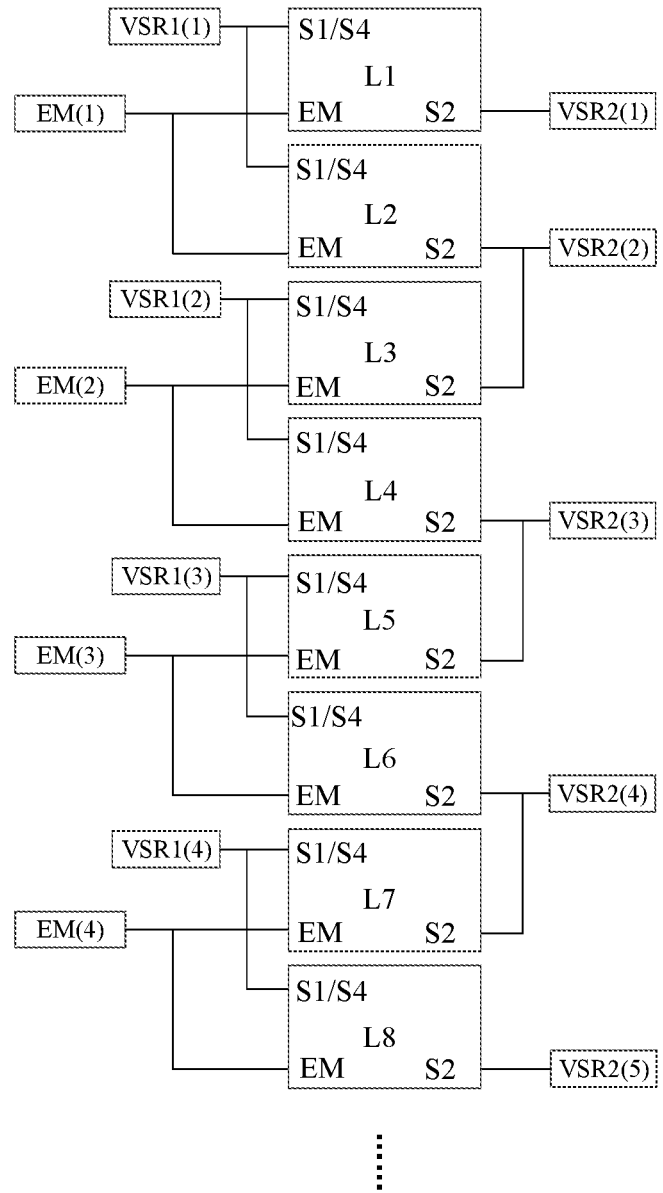
FIG. 13 is a schematic view illustrating connections of a part of first shift register units with a part of pixel circuit rows according to another embodiment of the present application.

Referring to FIGS. 13, L1 to L8 represents the first to the eighth rows of the pixel circuits 11, respectively. S4 represents a controlling terminal for the second initializing transistor T7 of the pixel circuit in a same row of pixel circuits. Taking L1 as an example, the VSR(1) represents the first one of the cascaded plurality of first shift register units VSR1. The VSR(1) is connected to the S4 in the L1 and the L2, which means the first one of first shift register units VSR1 is connected to the second initializing transistor T7 of every pixel circuit in the first row and the second row pixel circuits. That is, one single first shift register unit VSR1 can provide the second initialization controlling signal S4 for two adjacent rows of pixel circuits.

In some embodiments, the scanning signal provided by the first shift register unit VSR1 can be used as the first controlling signal S1 for the data writing transistor T2 and the second initialization controlling signal S4 for the second initializing transistor T7 at a same time, so each of the data writing transistor T2 and the second initializing transistor T7 may be a P-type transistor.

In some embodiments, the second shift register unit VSR2 may be connected to the first initializing signal line corresponding to the $(i+1)^{th}$ row of pixel circuits and the first initializing signal line corresponding to an $(i+2)^{th}$ row of pixel circuit. The second shift register unit VSR2 may be configured to provide the first initialization controlling signal S3 for the two adjacent rows of pixel circuits.

The second shift register unit VSR2 may be configured to provide the second controlling signal S2 for two adjacent rows of pixel circuits (i.e., the $i^{th}$ row of pixel circuits and the $(i-1)^{th}$ row of pixel circuits) such that the threshold compensating transistor T3 of the pixel circuit in the two rows of pixel circuits is turned on in response to a valid signal of the second controlling signal S2, so as to direct the data signal Vdata into the gates of the driving transistors T1. It should be understood that, since the first initializing signal line transistor T6 writes a first initializing signal Vref1 to the gate of the driving transistor T1 through the first initializing signal line, initialization of the gate of the driving transistor T1 should be before direction of the data signal Vdata into the gate of the driving transistor T1. That is, when the second shift register unit VSR2 provides the second controlling signal S2 for the $i^{th}$ row and the $(i-1)^{th}$ row of pixel circuits, initialization of the gates of the driving transistor T1 of the pixel circuit in the $i^{th}$ row and the $(i-1)^{th}$ row of pixel circuits should have been finished through the first initializing signal line. Therefore, when the second controlling signal S2 provided by the second shift register unit VSR2 is used as the first initialization controlling signal S3, what is initialized is the gate of the driving transistor T1 of the pixel circuit in two rows of pixel circuits after the $i^{th}$ row and the $(i-1)^{th}$ row of pixel circuit. That is, when the second shift register unit VSR2 provides the second controlling signal S2 for the $i^{th}$ row and the $(i-1)^{th}$ row of pixel circuits, the second shift register unit VSR2 may further provide the first initialization controlling signal S3 for the $(i+1)^{th}$ row and $(i+2)^{th}$ row of pixel circuits. That is, the scanning signal provided by the second shift register unit VSR2 can, when driving the threshold compensating transistor T3 of the pixel circuit in the $i^{th}$ row and the $(i-1)^{th}$ row of pixel circuits to be turned on, further drive the first initializing transistor T6 of the pixel circuit in the $(i+1)^{th}$ row and the $(i+2)^{th}$ row of pixel circuits to be turned on. By reusing the second controlling signal S2 provided by the second shift register unit VSR2 as the first initialization controlling signal S3 for next two rows of pixel circuits, the number of the shift register units required in the frame area of the display panel can be reduced, thereby reducing the frame area of the display panel and increasing the screen-to-body ratio of the display area.

Figure 14:
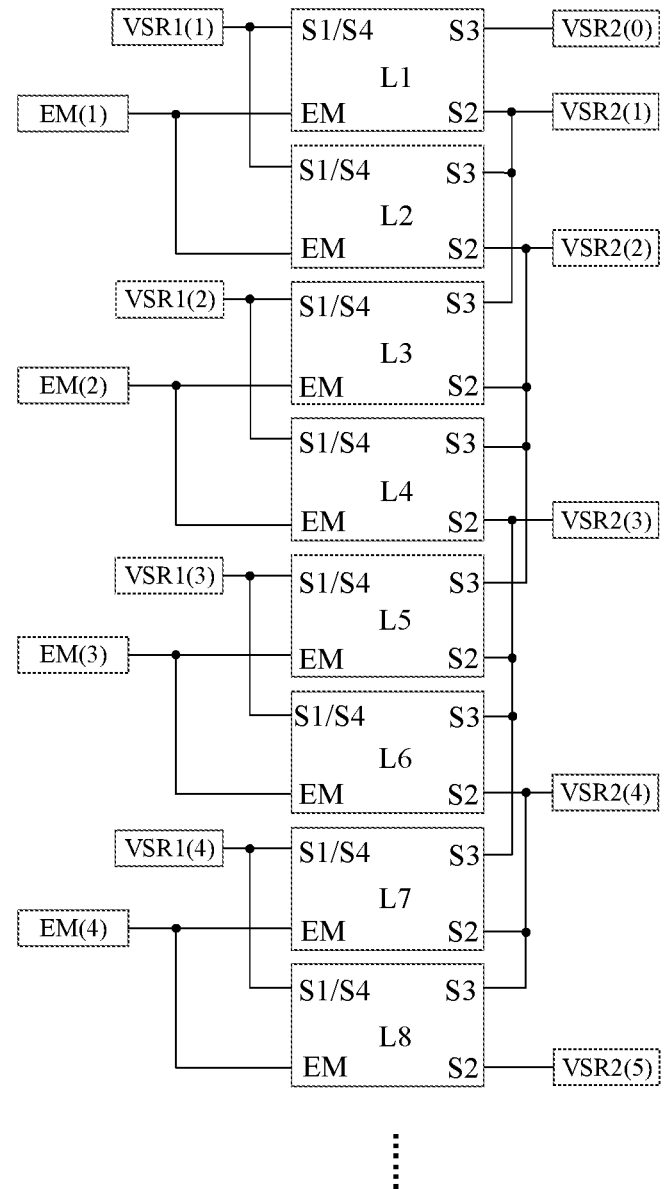
FIG. 14 is a schematic view illustrating connections of a part of second shift register units with a part of pixel circuit rows according to another embodiment of the present application.

With reference to FIG. 14, L1 to L8 represents the first to the eighth rows of the pixel circuits 11, respectively. S3 represents a controlling end for the first initializing transistor T6 of the pixel circuit in a same row of pixel circuits. Taking VSR2(2) as an example, the VSR2(2) is connected to the S2 in the L2 and in an L3 and is connected to the S3 in the L4 and in the L5, which means that the second shift register unit VSR2 corresponding to the VSR2(2) provide the second controlling signal S2 for the threshold compensating transistor T3 of the pixel circuit in the second row and the third row of pixel circuits, and further provides the first initialization controlling signal S3 for the first initializing transistor T6 of the pixel circuit in the fourth row and the fifth row of pixel circuits. That is, one single second shift register unit VSR2 can not only provide the second controlling signal S2 for two adjacent rows of pixel circuits, but also provide the second initialization controlling signal S4 for next two rows of pixel circuits.

Figure 15:
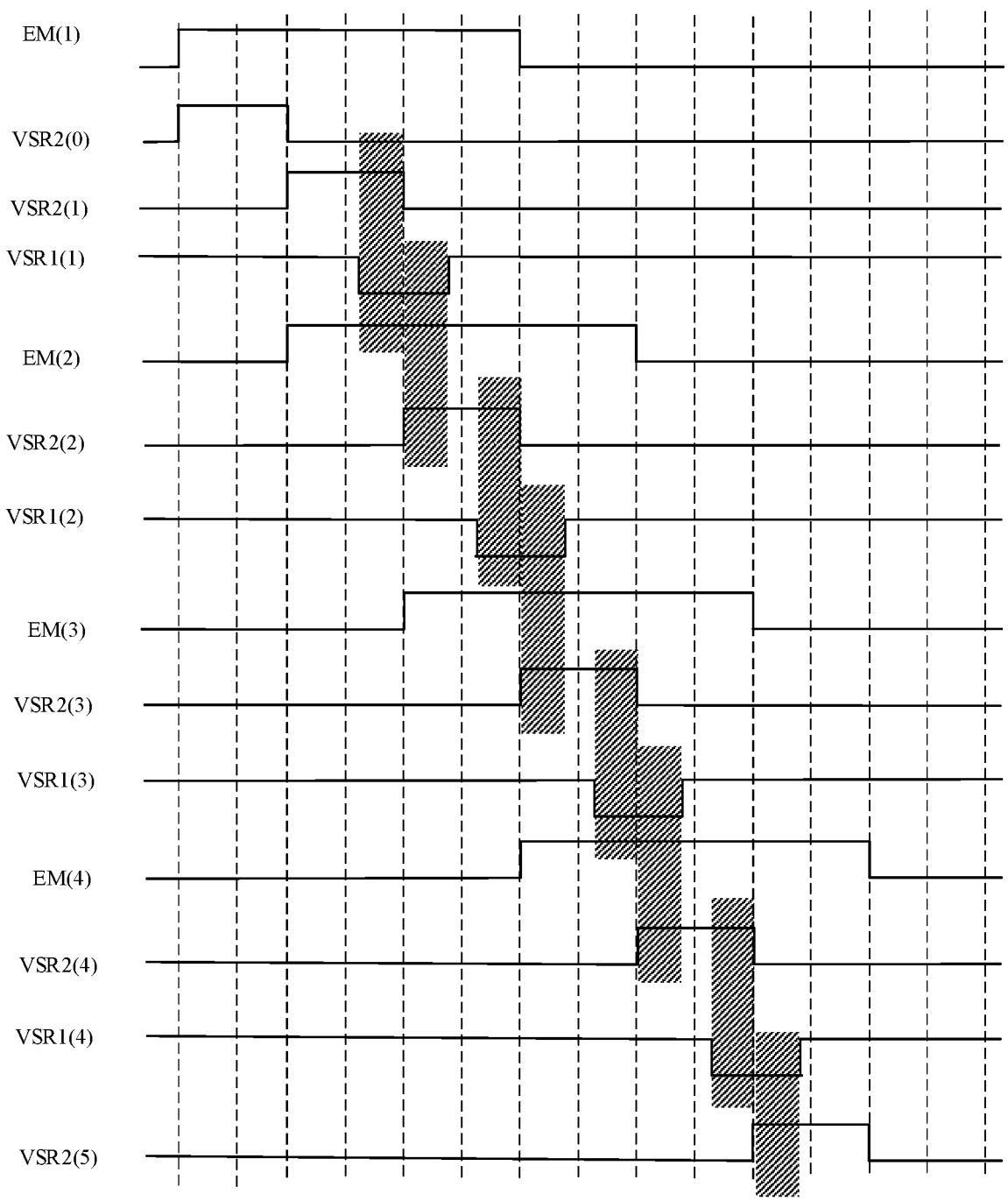
FIG. 15 is a signal time sequence view according to another embodiment of the present application.

Referring to both FIG. 14 and FIG. 15, for the first row (i.e., L1) of pixel circuits, the first initializing transistor T6 of every pixel circuit in the row of pixel circuits is connected to the second shift register unit VSR2 corresponding to VSR2(0). The VSR2(0) is a second shift register unit VSR2 in front of the VSR2(1), and is configured to provide the first initialization controlling signal S3 only for the first initializing transistor T6 of every pixel circuit in the row L1. The VSR2(0) may be connected to both the L1 and last three rows of pixel circuits in the display panel. The VSR2(0) may provide the second controlling signal S2 for the threshold compensating transistor T3 of the pixel circuit in last second row and last third row of pixel circuits, and further provide the first initialization controlling signal S3 for the first initializing transistor T6 of the pixel circuit in last first row and the first row of pixel circuits.

In some embodiments, the scanning signal provided by the second shift register unit VSR2 can be used as the second controlling signal S2 for the threshold compensating transistor T3 and the first initialization controlling signal S3 for the first initializing transistor T6 at a same time, so each of the threshold compensating transistor T3 and the first initializing transistor T6 may be a N-type transistor.

Figure 16:
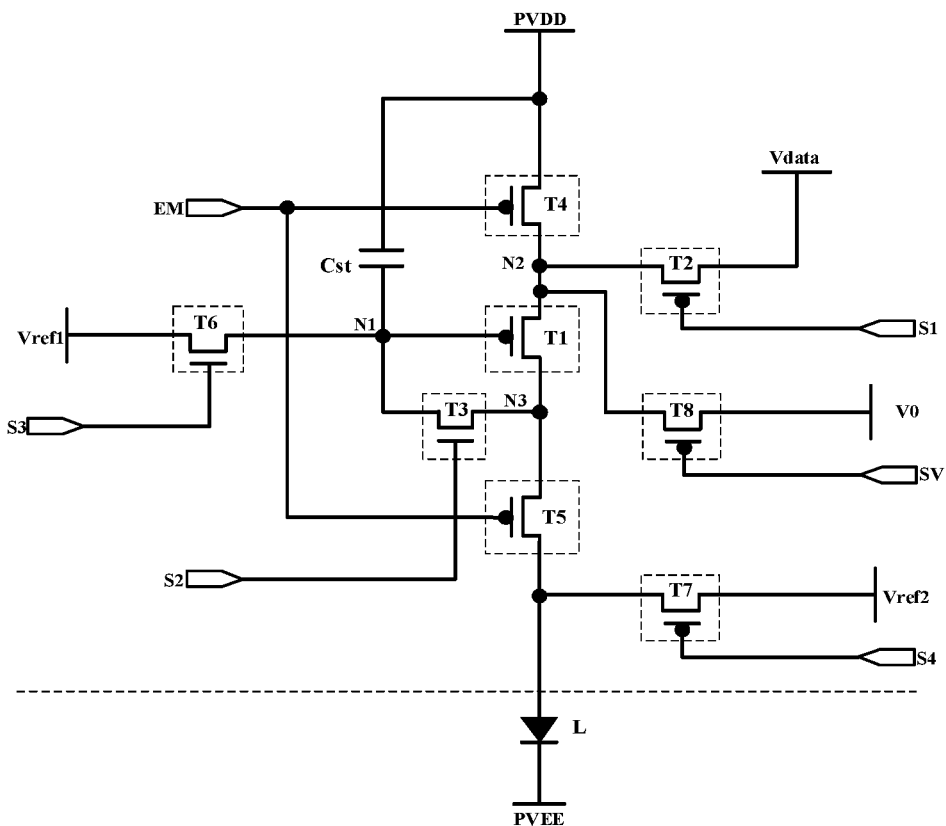
FIG. 16 is a schematic view of a pixel circuit according to yet another embodiment of the present application.
Figure 17:
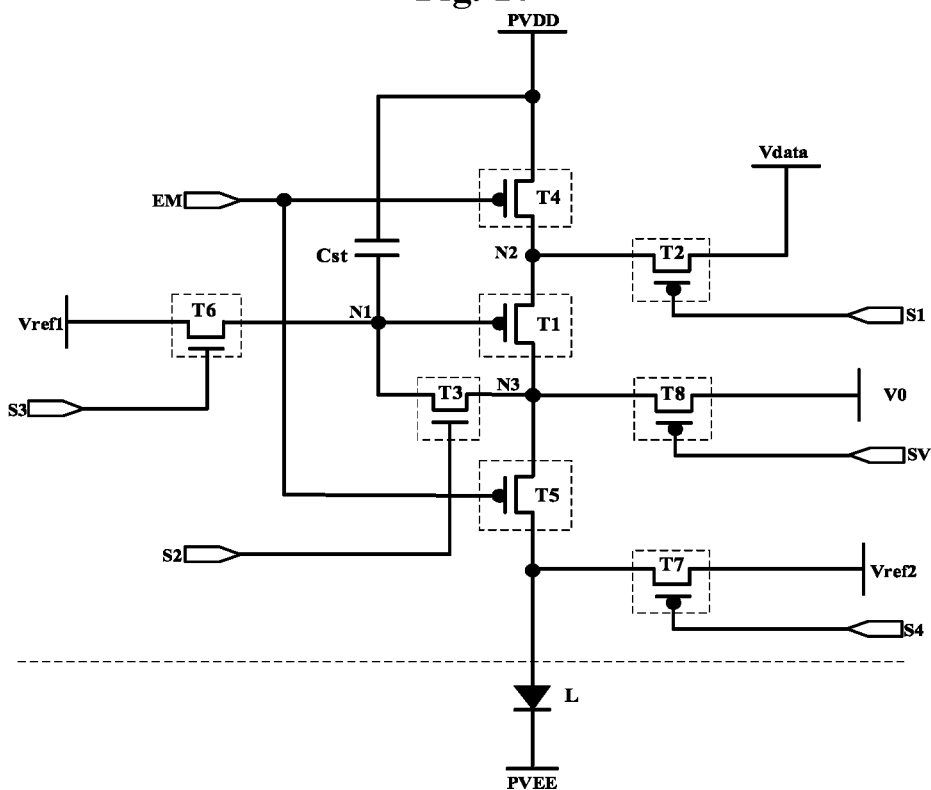
FIG. 17 is a schematic view of a pixel circuit according to yet another embodiment of the present application.

In some embodiments, the pixel circuit may further include a bias adjusting transistor T8. Referring to FIG. 16, the bias adjusting transistor T8 may be connected between the first electrode of the driving transistor T1 and a bias adjusting signal line. Alternatively, as shown in FIG. 17, the bias adjusting transistor T8 may be connected between the second electrode of the driving transistor T1 and a bias adjusting signal line.

The bias adjusting transistor T8 may be turned on in response to a bias adjustment controlling signal to provide the driving transistor T1 with a bias adjusting signal, so that a source and a drain of the driving transistor T1 can be turned on or off stably by the bias adjusting signal, which improves a phenomena such as characteristic shift and hysteresis that occur after a long-term operation.

It should be understood that, in the circuit structure of the pixel circuit in the above embodiments, the data signal Vdata is directed into the first electrode of the driving transistor T1 through the data writing transistor T2, and then is directed into the gate of the driving transistor T1 through the second electrode of the driving transistor T1 and the threshold compensating transistor T3.

Figure 18:
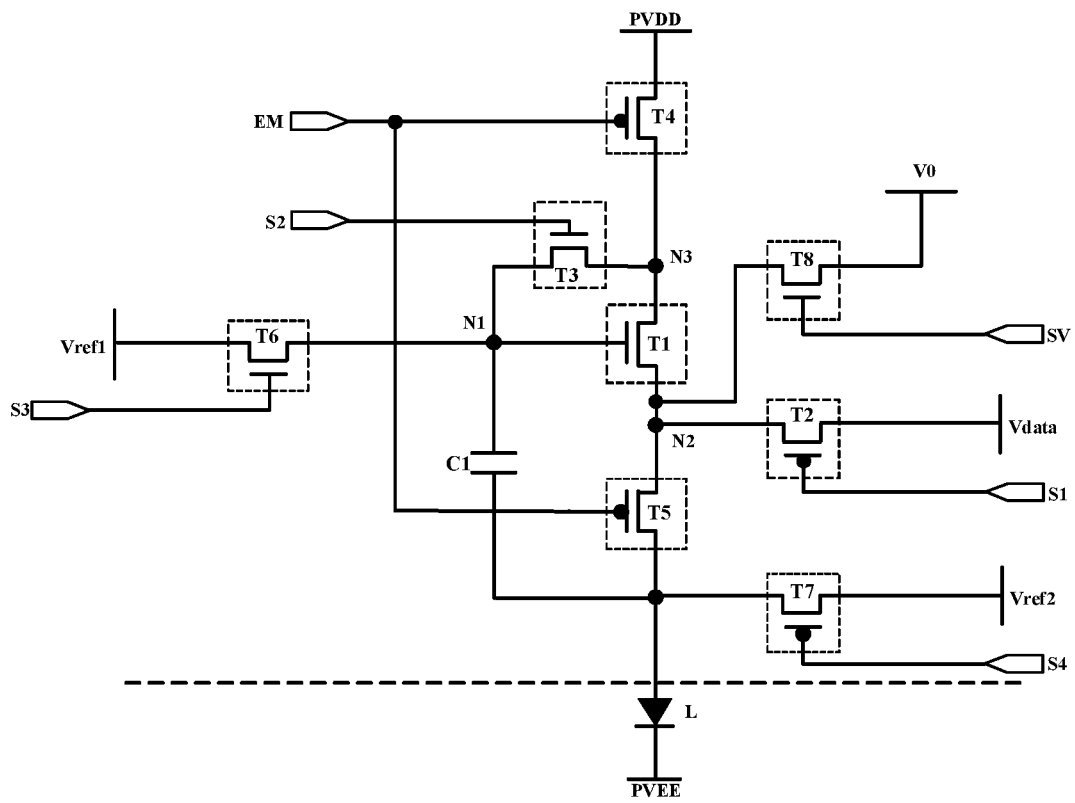
FIG. 18 is a schematic view of a pixel circuit according to yet another embodiment of the present application.

Referring to FIG. 18, in another embodiment, the data signal Vdata may be directed into the second electrode of the driving transistor T1 through the data writing transistor T2, and then is directed into the gate of the driving transistor T1 through the first electrode of the driving transistor T1 and the threshold compensating transistor T3. At this time, the bias adjusting transistor T8 is connected to the second electrode of the driving transistor T1.

Referring to both FIG. 16 and FIG. 18, when the data signal Vdata is written to the first electrode of the driving transistor T1, one terminal of a storage capacitor Cst is connected to the gate of the driving transistor T1, and the other terminal of the storage capacitor Cst is connected to the first power supply signal PVDD. When the data signal Vdata is written to the second electrode of the driving transistor T1, one terminal of the storage capacitor Cst is connected to the gate of the driving transistor T1, and the other terminal of the storage capacitor Cst is connected to the first electrode of the light-emitting element L.

Figure 19:
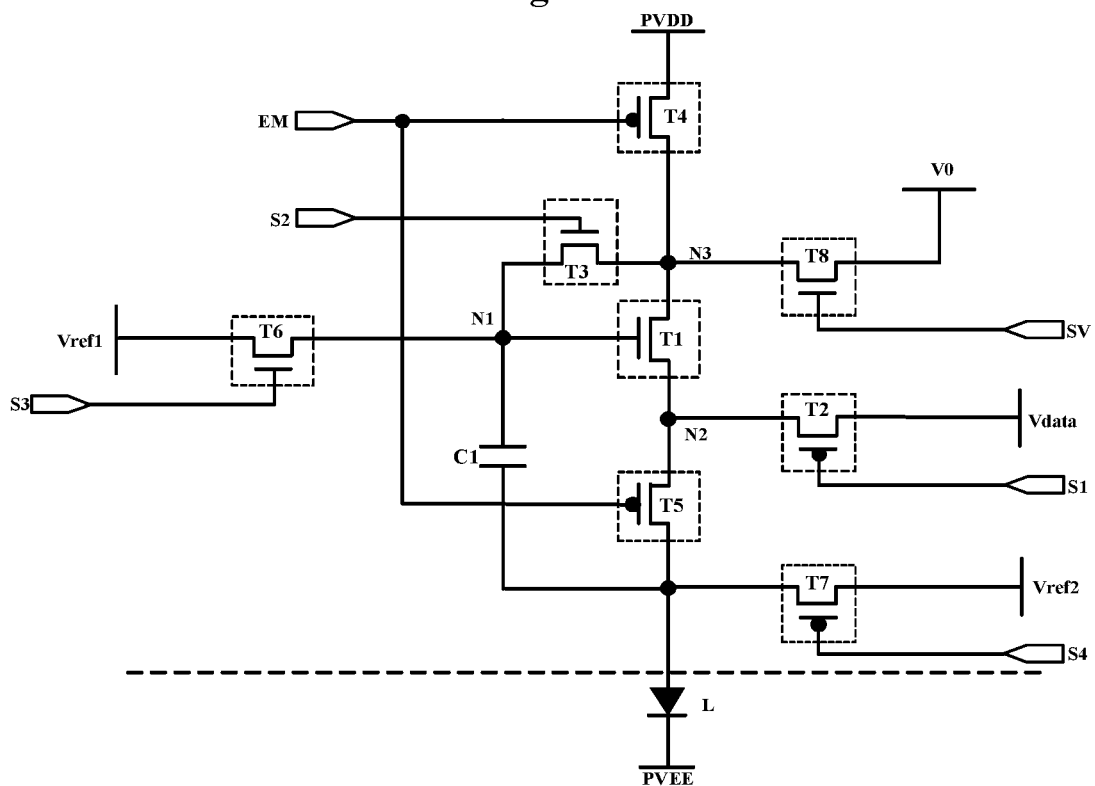
FIG. 19 is a schematic view of a pixel circuit according to yet another embodiment of the present application.

In some embodiments, as shown in FIG. 19, the bias adjusting transistor T8 may be connected to the first electrode of the driving transistor T1.

In some embodiments, the first shift register unit VSR1 may be connected to the bias adjustment controlling signal line corresponding to the $i^{th}$ row of pixel circuits and the bias adjustment controlling signal line corresponding to the $(i+1)^{th}$ row of pixel circuits. The first shift register unit VSR1 may be configured to provide the bias adjustment controlling signal for the two rows of pixel circuits.

The scanning signal provided by the first shift register unit VSR1 may be used as both the first controlling signal S1 and the bias adjustment controlling signal for the $i^{th}$ row and the $(i+1)^{th}$ row of pixel circuits. That is, the data writing transistors T2 and the bias adjusting transistors T8 in the two rows of pixel circuits can be turned on at a same time, and the data writing transistor T2 directs the data signal Vdata provided by the data signal line into the driving transistor T1, and the bias adjusting transistor T8 directs the bias adjusting signal into the source or the drain of the driving transistor T1 such that a voltage difference between the gate of the driving transistor T1 and the source and the drain of the driving transistor T1 satisfies a threshold voltage, which enables the driving transistor T1 to be turned-on stably. As shown in FIG. 16 to FIG. 19, when the scanning signal provided by the first shift register unit VSR1 is used as both the first controlling signal S1 and the bias adjustment controlling signal, the first controlling signal S1 is a same signal as the bias adjustment controlling signal SV.

By reusing the first controlling signal S1 provided by the first shift register unit VSR1 as the bias adjustment controlling signal for the two rows of pixel circuits, the number of the shift register units required in the frame area of the display panel can be reduced, thereby reducing the frame area of the display panel and increasing the screen-to-body ratio of the display area.

It should be understood that when the type of the bias adjusting transistor T8 is the same as that of the data writing transistor T2, the first controlling signal S1 provided by the first shift register unit VSR1 may be used as the bias adjustment controlling signal SV. When the type of the bias adjusting transistor T8 is the same as that of the threshold compensating transistor T3, the second controlling signal S2 provided by the second shift register unit VSR2 may be used as the bias adjustment controlling signal SV.

Figure 20:
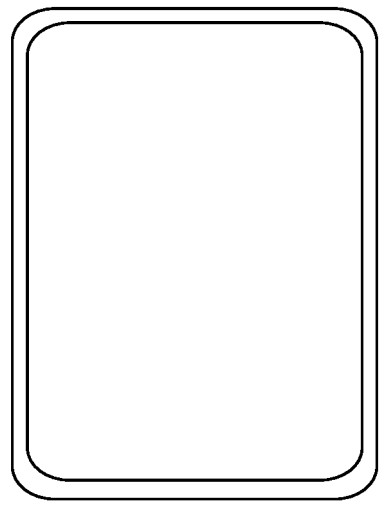
FIG. 20 is a schematic structural view of a display device according to an embodiment of the present application.

The embodiments of the present application further provides a display device, as shown in FIG. 20. The display device may be a PC, a TV, a display device, a mobile terminal, a tablet computer, a wearable device, etc., and the display device may include the display panel provided by the embodiments of the present application.

The functional blocks shown in the structural views described above may be implemented as hardware, software, firmware, or a combination thereof. When implemented as hardware, it may be, for example, an electronic circuit, an application specific integrated circuit (ASIC), appropriate firmware, plugins, function cards, etc. When implemented as software, elements of the present application are programs or code segments for performing required tasks. The programs or code segments may be stored in a machine-readable medium, or transmitted on a transmission medium or a communication link through a data signal carried in a carrier wave. The "machine-readable medium" may include any medium that can store or transmit information. Examples of the machine-readable medium include an electronic circuit, a semiconductor memory device, a ROM, a flash memory, an erasable ROM (EROM), a floppy disk, a CD-ROM, an optical disk, a hard disk, a fiber optic medium, a radio frequency (RF) link, and so on. The code segments may be downloaded via a computer network such as the Internet, intranet, and so on.

It should be noted that, in this application, the terms "include", "comprise", or any other variation thereof, are intended to cover a non-exclusive inclusion, such that a process, method, article or device that includes a series of elements not only includes those elements but also may include other elements not explicitly listed or inherent to such process, method, article or device.

The principles and implementations of the present application are described herein by reference to specific examples. The descriptions of the examples are only intended to facilitate understanding of the methods and core concepts of the present application. The above descriptions are provided only for illustrate preferred embodiments of the present application. It should be noted that because what can be expressed by words are limited but specific structures are objectively unlimited, for a person skilled in the art, various improvements, modifications or changes to the present application can be made and the technical features described above can be combined in an appropriate way without departing from the principles of the present application; and all of these improvements, modifications or combinations, or an application of the concepts and technical solutions of the present application directly to any other situation without improvement are within the protection scope of the present application.

What is claimed is:

1. A display panel, comprising:
   a plurality of light-emitting pixels arranged in an array, the light-emitting pixels comprising respective pixel circuits and light-emitting elements, and each of the pixel circuits comprising a driving transistor, a data writing transistor and a threshold compensating transistor, wherein the driving transistor is configured to provide a drive current for a light-emitting element driven by the pixel circuit, and the data writing transistor and the threshold compensating transistor are of different types;
   a first shift register unit connected to data writing transistors in an $i^{th}$ row of pixel circuits and data writing transistors in an $(i+1)^{th}$ row of pixel circuits, and configured to provide a first controlling signal for the two adjacent rows of pixel circuits, wherein for each of the $i^{th}$ and $(i+1)^{th}$ rows of pixel circuits, a first electrode of the respective data writing transistor is electrically connected to a data signal line, a second electrode of the respective data writing transistor is electrically connected to a first electrode of the respective threshold compensating transistor, and the respective data writing transistor is turned on in response to the first controlling signal; and a second shift register unit connected to threshold compensating transistors in the $i^{th}$ row of pixel circuits and threshold compensating transistors in an $(i-1)^{th}$ row of pixel circuits, and configured to provide a second controlling signal for the two adjacent rows of pixel circuits, wherein for each of the $i^{th}$ and $(i-1)^{th}$ rows of pixel circuits, a first electrode of the respective threshold compensating transistor is electrically connected to a second electrode of the respective data writing transistor, a second electrode of the respective threshold compensating transistor is electrically connected to a gate of the respective driving transistor, and the respective threshold compensating transistor is turned on in response to the second controlling signal; and wherein for each of the pixel circuits, a first turn-on period of the respective data writing transistor is partially overlapped with a second turn-on period of the respective threshold compensating transistor, where i is a positive integer, wherein the first turn-on period is between a falling edge and a rising edge of the first controlling signal, and the second turn-on period is between a rising edge and a falling edge of the second controlling signal; and wherein the rising edge of the second controlling signal is before the falling edge of the first controlling signal, and the falling edge of the second controlling signal is before the rising edge of the first controlling signal; or the rising edge of the second controlling signal is after the falling edge of the first controlling signal, and the falling edge of the second controlling signal is after the rising edge of the first controlling signal.

2. The display panel according to claim 1, wherein for each of the pixel circuits, the data writing transistor is a P-type transistor, and the threshold compensating transistor is an N-type transistor.

3. The display panel according to claim 1, wherein the display panel comprises a plurality of first shift register units that are in a cascade connection and a plurality of second shift register units that are in a cascade connection, and the pixel circuits comprises a first row of pixel circuits and a second row of pixel circuits;

the respective data writing transistor in each of the first row of pixel circuits is connected to a $j^{th}$ first shift register unit, and the respective threshold compensating transistor in each of the first row of pixel circuits is connected to a kth second shift register unit;

the respective data writing transistor in each of the second row of pixel circuits is connected to the $j^{th}$ first shift register unit, and the respective threshold compensating transistor in each of the second row of pixel circuits is connected to a $(k+1)^{th}$ second shift register unit; and a first controlling signal provided by the $j^{th}$ first shift register unit and a second controlling signal provided by the $k^{th}$ second shift register unit have a first overlapped period, and the first controlling signal provided by the $j^{th}$ first shift register unit and a second controlling signal provided by the $(k+1)^{th}$ second shift register unit have a second overlapped period, where j and k are positive integer.

4. The display panel according to claim 3, wherein a time length of the first overlapped period is equal to a time length of the second overlapped period.

5. The display panel according to claim 1, wherein for each of the pixel circuits, a first electrode of the driving transistor is connected to a first power supply signal, and a second electrode of the driving transistor is connected to a first electrode of the light-emitting element, and a second electrode of the light-emitting element is connected to a second power supply signal;

the first electrode of the data writing transistor is connected to the data signal line, and the second electrode of the data writing transistor is connected to the first electrode of the driving transistor, and the data writing transistor is configured to direct a data signal into the pixel circuit when the data writing transistor is driven by the first controlling signal; and the first electrode of the threshold compensating transistor is connected to the second electrode of the driving transistor, and the second electrode of the threshold compensating transistor is connected to the gate of the driving transistor, and the threshold compensating transistor is configured to direct the data signal into the gate of the driving transistor when the threshold compensating transistor is driven by the second controlling signal.

6. The display panel according to claim 5, wherein each of the pixel circuits further comprises at least one of a first light-emission controlling transistor and a second light-emission controlling transistor to selectively allow the light-emitting element to enter a light-emitting stage, wherein the first light-emission controlling transistor is connected between the first electrode of the driving transistor and the first power supply signal, and the second light-emission controlling transistor is connected between the second electrode of the driving transistor and the first electrode of the light-emitting element.

7. The display panel according to claim 6, wherein the display panel further comprises:

a third shift register unit connected to the first light-emission controlling transistor and the second light-emission controlling transistor in the $i^{th}$ and $(i+1)^{th}$ rows of pixel circuits, wherein the third shift register unit is configured to provide a light-emission controlling signal for the $i^{th}$ and $(i+1)^{th}$ rows of pixel circuits, and the first light-emission controlling transistor and the second light-emission controlling transistor in each of the $i^{th}$ and $(i+1)^{th}$ rows of pixel circuits are turned on in response to the light-emission controlling signal.

8. The display panel according to claim 6, wherein each of the pixel circuits further comprises:

a first initializing transistor connected between the gate of the driving transistor and a first initializing signal line, and turned on in response to a first initialization controlling signal; and a second initializing transistor connected between the first electrode of the light-emitting element and a second initializing signal line, and turned on in response to a second initialization controlling signal.

9. The display panel according to claim 8, wherein the first shift register unit is connected to the second initializing signal line corresponding to the $i^{th}$ row of pixel circuits and the second initializing signal line corresponding to the $(i+1)^{th}$ row of pixel circuits, and the first shift register unit is further configured to provide the second initialization controlling signal for the $i^{th}$ and $(i+1)^{th}$ rows of pixel circuits.

10. The display panel according to claim 9, wherein the data writing transistor and the second initializing transistor in each of the $i^{th}$ and $(i+1)^{th}$ rows of pixel circuits are P-type transistors.

11. The display panel according to claim 8, wherein the second shift register unit is connected to the first initializing signal line corresponding to the $(i+1)^{th}$ row of pixel circuits and the first initializing signal line corresponding to an $(i+2)^{th}$ row of pixel circuits, and the second shift register unit is further configured to provide the first initialization controlling signal for the $(i+1)^{th}$ and $(i+2)^{th}$ rows of pixel circuits.

12. The display panel according to claim 11, wherein the threshold compensating transistor and the second initializing transistor in each of the $(i+1)^{th}$ and $(i+2)^{th}$ rows of pixel circuits are N-type transistors.

13. The display panel according to claim 6, wherein each of the pixel circuits further comprises:
   a bias adjusting transistor connected between the first electrode of the driving transistor and a bias adjusting signal line, or connected between the second electrode of the driving transistor and a bias adjusting signal line, and turned on in response to a bias adjustment controlling signal.

14. The display panel according to claim 13, wherein the first shift register unit is connected to the bias adjustment controlling signal line corresponding to the $i^{th}$ row of pixel circuits and the bias adjustment controlling signal line corresponding to the $(i+1)^{th}$ row of pixel circuits, and the first shift register unit is further configured to provide the bias adjustment controlling signal for the $i^{th}$ and $(i+1)^{th}$ rows of pixel circuits.

15. A display device, comprising the display panel according to claim 1.

* * * * *